(12) United States Patent
Mine et al.

(10) Patent No.: US 10,513,795 B2
(45) Date of Patent: Dec. 24, 2019

(54) PLATING APPARATUS, PLATING METHOD, AND SUBSTRATE HOLDER

(71) Applicant: EBARA CORPORATION, Tokyo (JP)

(72) Inventors: Junko Mine, Tokyo (JP); Tsutomu Nakada, Tokyo (JP); Mitsutoshi Yahagi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/396,384

(22) Filed: Apr. 26, 2019

(65) Prior Publication Data

US 2019/0249326 A1    Aug. 15, 2019

Related U.S. Application Data

(62) Division of application No. 15/248,248, filed on Aug. 26, 2016, now Pat. No. 10,316,426.

(30) Foreign Application Priority Data

Aug. 28, 2015 (JP) ................. 2015-168969

(51) Int. Cl.
| | |
|---|---|
| *C25D 21/12* | (2006.01) |
| *H01L 23/00* | (2006.01) |
| *H01L 21/687* | (2006.01) |
| *C25D 5/18* | (2006.01) |
| *C25D 17/06* | (2006.01) |
| *C25D 17/00* | (2006.01) |

(52) U.S. Cl.
CPC .............. *C25D 21/12* (2013.01); *C25D 5/18* (2013.01); *C25D 17/001* (2013.01); *C25D 17/005* (2013.01); *C25D 17/06* (2013.01); *H01L 21/68785* (2013.01); *H01L 24/11* (2013.01); *C25D 17/008* (2013.01); *H01L 2224/11462* (2013.01); *H01L 2224/13147* (2013.01)

(58) Field of Classification Search
CPC ........ C25D 21/12; C25D 5/18; C25D 17/001; C25D 17/005; C25D 17/007; H01L 21/68785

See application file for complete search history.

(56) References Cited

U.S. PATENT DOCUMENTS

2013/0001073 A1    1/2013    Noda et al.

FOREIGN PATENT DOCUMENTS

| JP | H03-029876 A | 2/1991 |
|---|---|---|
| JP | H05-239698 A | 9/1993 |
| JP | H09-125294 A | 5/1997 |
| JP | 2001-234397 A | 8/2001 |
| JP | 2005-029863 A | 2/2005 |
| JP | 2010-209440 A | 9/2010 |
| JP | 2013-194309 A | 9/2013 |

*Primary Examiner* — Nicholas A Smith
(74) *Attorney, Agent, or Firm* — Baker & Hostetler LLP

(57) ABSTRACT

In-plane uniformity of a film that is plated on a polygonal substrate is enhanced. An anode holder configured to hold an anode, a substrate holder configured to hold a polygonal substrate, a plating bath for accommodating the anode holder and the substrate holder, and dipping the anode and the substrate in a plating solution, and a control device for controlling a current that flows between the anode and the substrate are included. The substrate holder has a plurality of power feeding members that are disposed along respective sides of the polygonal substrate. The control device is configured to be able to control the current so that currents of at least two different values are simultaneously supplied to the plurality of power feeding members.

9 Claims, 15 Drawing Sheets

PLATING APPARATUS, PLATING METHOD, AND SUBSTRATE HOLDER

CROSS-REFERENCE TO RELATED APPLICATION

This application is a divisional of U.S. application Ser. No. 15/248,248, filed Aug. 26, 2016, which claims priority under the Paris Convention to Japanese Patent Application No. 2015-168969 filed on Aug. 28, 2015. The entire disclosure of Japanese Patent Application No. 2015-168969 filed on Aug. 28, 2015 including specification, claims, drawings and summary is incorporated herein by reference in its entirety.

TECHNICAL FIELD

The present invention relates to a plating apparatus, a plating method, and a substrate holder.

BACKGROUND ART

Conventionally, wirings have been formed in microscopic wiring grooves, holes or resist opening portions which are provided on the surfaces of substrates of semiconductor wafers and the like, bumps (protruded electrodes) to be electrically connected to electrodes and the like of packages have been formed on the surfaces of substrates. As the methods for forming the wirings and bumps, an electrolytic plating method, a vacuum evaporation method, a printing method, a ball bump method and the like are known, for example. With increase in the number of I/O, and narrowing of pitches in semiconductor chips, an electrolytic plating method which enables miniaturization and is relatively stable in performance has come to be used frequently.

When wiring or a bump is formed by an electrolytic plating method, a seed layer (a power feeding layer) with low electric resistance is formed on the surface of a barrier metal which is provided in a wiring groove, a hole or a resist opening portion on a substrate. On the surface of the seed layer, a plated layer, i.e. a plating film grows.

In general, a substrate which is plated has electric contacts in a peripheral portion thereof. Consequently, in a central portion of the substrate, a current which corresponds to a combined resistance of an electric resistance value of a plating solution and an electric resistance value of a seed layer from the central portion of the substrate to the electric contacts flows. Meanwhile, in the peripheral portion (the vicinity of the electric contacts) of the substrate, a current which substantially corresponds to the electric resistance value of the plating solution flows. That is, a current is difficult to flow correspondingly to the electric resistance value of the seed layer from the central portion of the substrate to the electric contact points. The phenomenon in which a current concentrates on the peripheral portion of the substrate is called a terminal effect.

As the shape of the substrate which is plated by an electrolytic plating method, a circular substrate and a quadrangular substrate are known (refer to Japanese Patent Laid-Open No. 09-125294 and Japanese Examined Patent Publication No. 03-029876, for example).

In a circular substrate, a distance from a central portion of the circular substrate to a peripheral portion of the substrate is the same throughout an entire circumference of the substrate. Consequently, the terminal effect at the time of plating the circular substrate occurs substantially similarly throughout the entire circumference of the substrate. Accordingly, when plating is applied to the circular substrate, a plating speed in the central portion of the substrate is lower as compared with that in the peripheral portion of the substrate, and the film thickness or thickness of the layer of the plating film in the central portion of the substrate becomes thinner than that of the plating film in the peripheral portion of the substrate. Conventionally, in order to restrain reduction of in-plane uniformity of the film thickness by a terminal effect, an electric field which is applied to the circular substrate has been regulated by using a regulation plate as is disclosed in Japanese Patent Laid-Open No. 2005-029863, for example, while a current is uniformly supplied from the peripheral portion of the circular substrate.

However, in a polygonal substrate, the distance from a central portion of the polygonal substrate to a peripheral portion of the polygonal substrate differs depending on the position. That is, the distance from the central portion of the substrate to a central portion (a central portion between vertexes) of a side of the polygonal substrate is relatively short, and a distance from the central portion of the substrate from a vicinity of the vertex of the polygonal substrate is relatively long. Consequently, the terminal effect at the time of plating the polygonal substrate occurs ununiformly throughout the entire perimeter of the substrate.

In studying the plating method and the plating apparatus for a polygonal substrate, the present inventors have studied the change of a current density distribution on the polygonal substrate accompanying advance of electrolytic plating. FIG. 21A to FIG. 21D are schematic views showing a change of the current density distribution accompanying advance of plating when plating is applied to a quadrangular substrate which is an example of a polygonal substrate. FIG. 21A shows a current density distribution of the quadrangular substrate at an initial stage of plating. As shown in FIG. 21A, in a center portion C1 of a quadrangular substrate S1, an electric resistance value is higher as compared with that in a peripheral portion due to a terminal effect, and therefore, a current density is the smallest. In the stage shown in FIG. 21A, a side central region A1 of the quadrangular substrate S1 is at a relatively shorter distance from the center portion C1 of the quadrangular substrate S1, and therefore, an electric resistance value in the side central region A1 is lower as compared with an electric resistance value in a corner region A2. Consequently, an electric field relatively concentrates on the side central region A1, and a current density becomes high. Meanwhile, at the corner region A2 in a vicinity of a vertex of the quadrangular substrate S1 and an intermediate region A3 which is located between the side central region A1 and the corner region A2, distances from the center portion C1 are longer as compared with the side central region A1, and therefore, electric resistance values are higher as compared with that in the side central region A1. Consequently, in the stage shown in FIG. 21A, an electric field does not concentrate on the corner region A2 and the intermediate region A3 so much as on the side central region A1.

When plating advances, an electric field also starts to concentrate on the corner portion A2 which is at a relatively long distance from the center portion C1, as shown in FIG. 21B. Meanwhile, current densities in the side central region A1 and the intermediate region A3 become smaller as compared with current densities in the side central region A1 and the intermediate region A3 shown in FIG. 21A. This is because as plating advances and the film thickness becomes larger, the influence of the terminal effect gradually becomes smaller.

Plating further advances, and the film thickness becomes larger, whereby concentration of the electric field onto the side central region A1 is relieved, as shown in FIG. 21C. Consequently, a difference between the current density of the side central region A1 and the current density of the intermediate region A3 becomes smaller as compared with FIG. 21A and FIG. 21B. Meanwhile, concentration of the electric field onto the corner region A2 does not change so much even when plating advances.

When plating further advances, the difference of the current density in the side central region A1 and the current density in the intermediate region A3 substantially disappears, as shown in FIG. 21D. Meanwhile, in the corner region A2, concentration of the electric field continuously occurs.

As explaining in relation to FIG. 21A to FIG. 21D, in the side central region A1 of the quadrangular substrate S1, the electric field concentrates at the initial stage of plating, and the current density becomes smaller as plating advances. In contrast to this, in the intermediate region A3 of the quadrangular substrate S1, the current density is smaller than the current density in the side central region A1 at the initial stage of plating, and as plating advances, the difference from the side central region A1 becomes smaller. Accordingly, in the side central region A1, a film thickness of plating tends to be larger than the film thickness of plating in the intermediate region A3.

Meanwhile, although in the corner region A2 of the quadrangular substrate S1, concentration of the electric field is somewhat small at the initial stage of plating, the electric field continues to concentrate consistently from the initial stage of plating to an end time. Consequently, in the corner region A2, the film thickness tends to be larger as compared with the film thickness in the side central region A1 and the intermediate region A3.

As above, the terminal effect in the polygonal substrate differs depending on the position of the peripheral portion of the substrate, and therefore, ununiformity in the current density distribution occurs in the peripheral portion of the substrate. Consequently, the present inventors have found out that in-plane uniformity of the film which is plated on the polygonal substrate is lower as compared with the in-plane uniformity of the film plated on a circular substrate.

The present invention is made in the light of the above described problem, and an object of the present invention is to enhance in-plane uniformity of a film which is plated on a polygonal substrate.

SUMMARY OF INVENTION

According to a first aspect of the present invention, a plating apparatus is provided. The plating apparatus has an anode holder configured to hold an anode, a substrate holder configured to hold a polygonal substrate, a plating bath for accommodating the anode holder and the substrate holder, and dipping the anode and the substrate in a plating solution, and a control device for controlling a current that flows between the anode and the substrate. The substrate holder has a plurality of power feeding members that are disposed along respective sides of the polygonal substrate. The control device is configured to be able to control the current so that currents of at least two different values are simultaneously supplied to the plurality of power feeding members.

According to a second aspect of the present invention, in the first aspect of the above described plating apparatus, the power feeding members include first power feeding members capable of contacting side central regions including central portions of the sides of the polygonal substrate, and second power feeding members capable of contacting intermediate regions adjacent to the side central regions and/or third power feeding members capable of contacting regions that are closer to corner portions of the polygonal substrate than the intermediate regions, and the control device is configured to be able to control the current to supply currents of different values respectively to the first power feeding members, and the second power feeding members and/or the third power feeding members.

According to a third aspect of the present invention, in the second aspect of the above described plating apparatus, the control device is configured to be able to control the currents so that a value of a current that flows in the second power feeding members becomes larger than a value of a current that flows in the first power feeding members.

According to a fourth aspect of the present invention, in the second or the third aspect of the above described plating apparatus, the control device is configured to be able to control the currents so that a current of a first value is supplied to the first power feeding members at a time of start of plating, and thereafter a current of a second value that is larger than the first value is supplied to the first power feeding members.

According to a fifth aspect of the present invention, in the fourth aspect of the above described plating apparatus, the control device is configured to be able to control the currents so that the current that flows in the first power feeding members increases stepwise from the first value to the second value.

According to a sixth aspect of the present invention, in the fourth aspect of the above described plating apparatus, the control device is configured to be able to control the currents so that the current which flows in the first power feeding members increases continuously from the first value to the second value.

According to a seventh aspect of the present invention, in any one of the second aspect to the sixth aspect of the above described plating apparatus, the control device is configured to be able to control the currents so that a value of the current that flows in the third power feeding members becomes smaller than the value of the current that flows in the first power feeding members.

According to an eighth aspect of the present invention, in any one of the second aspect to the seventh aspect of the above described plating apparatus, the third power feeding members are configured to contact regions other than points of intersection of the sides of the polygonal substrate.

According to a ninth aspect of the present invention, a method for plating a polygonal substrate by passing a current between an anode and the polygonal substrate is provided. The method has a step of bringing a plurality of power feeding members into contact with the polygonal substrate along respective sides of the polygonal substrate, a step of dipping the anode and the polygonal substrate in a plating solution, and a step of simultaneously supplying currents of at least two different values to the plurality of power feeding members.

According to a tenth aspect of the present invention, in the ninth aspect of the above described plating method, the step of bringing the plurality of power feeding members into contact includes a step of bringing first power feeding members into contact with side central regions including central portions of the sides of the polygonal substrate, and a step of bringing second power feeding members into contact with intermediate regions adjacent to the side central regions, and/or bringing third power feeding members into contact with regions that are closer to corner portions of the polygonal substrate than the intermediate regions, and the step of supplying the currents includes a step of supplying currents of different values respectively to the first power feeding members, and the second power feeding members and/or the third power feeding members.

According to an eleventh aspect of the present invention, in the tenth aspect of the above described plating method, the step of supplying the currents includes a step of supplying the currents to the first power feeding members and the second power feeding members so that a value of a current flowing in the second power feeding members becomes larger than a value of a current flowing in the first power feeding members.

According to a twelfth aspect of the present invention, in the tenth or the eleventh aspect of the above described plating method, the step of supplying the currents includes a step of supplying a current of a first value to the first power feeding members at a time of start of plating, and thereafter supplying a current of a second value that is larger than the first value to the first power feeding members.

According to a thirteenth aspect of the present invention, in the twelfth aspect of the above described plating method, the step of supplying the currents includes a step of increasing the current that flows in the first power feeding members stepwise from the first value to the second value.

According to a fourteenth aspect of the present invention, in the twelfth aspect of the above described plating method, the step of supplying the currents includes a step of continuously increasing the current that flows in the first power feeding members from the first value to the second value.

According to a fifteenth aspect of the present invention, in any one of the tenth aspect to the fourteenth aspect of the above described plating method, the step of supplying the currents includes a step of supplying currents to the first power feeding members and the third power feeding members so that a value of a current flowing in the third power feeding members becomes smaller than a value of the current flowing in the first power feeding members.

According to a sixteenth aspect of the present invention, in any one of the tenth aspect to the fifteenth aspect of the above described plating method, the step of bringing the third power feeding members into contact with the corner regions of the polygonal substrate includes a step of bringing the third power feeding members into contact with regions other than points of intersection of the sides of the polygonal substrate.

According to a seventeenth aspect of the present invention, a substrate holder for holding a polygonal substrate is provided. The substrate holder has a substrate holding surface for holding the polygonal substrate, and a plurality of power feeding members for feeding power to the polygonal substrate held on the substrate holding surface, the power feeding members have contact sections configured to be able to contact the polygonal substrate, and the contact sections are aligned in a substantially straight line to be along sides of the polygonal substrate.

According to an eighteenth aspect of the present invention, in the seventeenth aspect of the above described substrate holder, the substrate holder has an external contact section that is electrically connected to power supplies for supplying currents to the power feeding members, and a connection unit that connects the external contact section and the power feeding members, the power feeding members include first power feeding members capable of contacting side central regions including central portions of the sides of the polygonal substrate, and second power feeding members capable of contacting intermediate regions adjacent to the side central regions and/or third power feeding members capable of contacting regions that are closer to corner portions of the polygonal substrate than the intermediate regions, and the connection unit has a plurality of connection units that are respectively connected to the first power feeding members, and the second power feeding members and/or the third power feeding members from the external contact section, and are electrically independent from one another.

According to a nineteenth aspect of the present invention, in the eighteenth aspect of the above described substrate holder, the external contact section has a plurality of first external contact sections that are connected to the first power feeding members via the connection unit, and a plurality of second external contact sections that are connected to the second power feeding members via the connection unit and/or a plurality of third external contact sections that are connected to the third power feeding members via the connection unit, and the connection units have a plurality of first contact wirings that are respectively connected to the plurality of first external contact sections, a first plate that is connected to the plurality of first contact wirings, and a first power feeding wiring that electrically connects the first plate and the first power feeding members, and a plurality of second contact wirings that are respectively connected to the plurality of second external contact sections, a second plate that is connected to the plurality of second contact wirings, and a second power feeding wiring that electrically connects the second plate and the second power feeding members, and/or a plurality of third contact wirings that are respectively connected to the plurality of third external contact sections, a third plate that is connected to the plurality of third contact wirings, and a third power feeding wiring that electrically connects the third plate and the third power feeding members.

According to a twentieth aspect of the present invention, in the seventeenth aspect to the nineteenth aspect of the above described substrate holder, the third power feeding members are configured to contact regions other than points of intersection of the sides of the polygonal substrate.

According to the present invention, in-plane uniformity of the film which is plated on the polygonal substrate can be enhanced.

DESCRIPTION OF EMBODIMENTS

Figure 1:
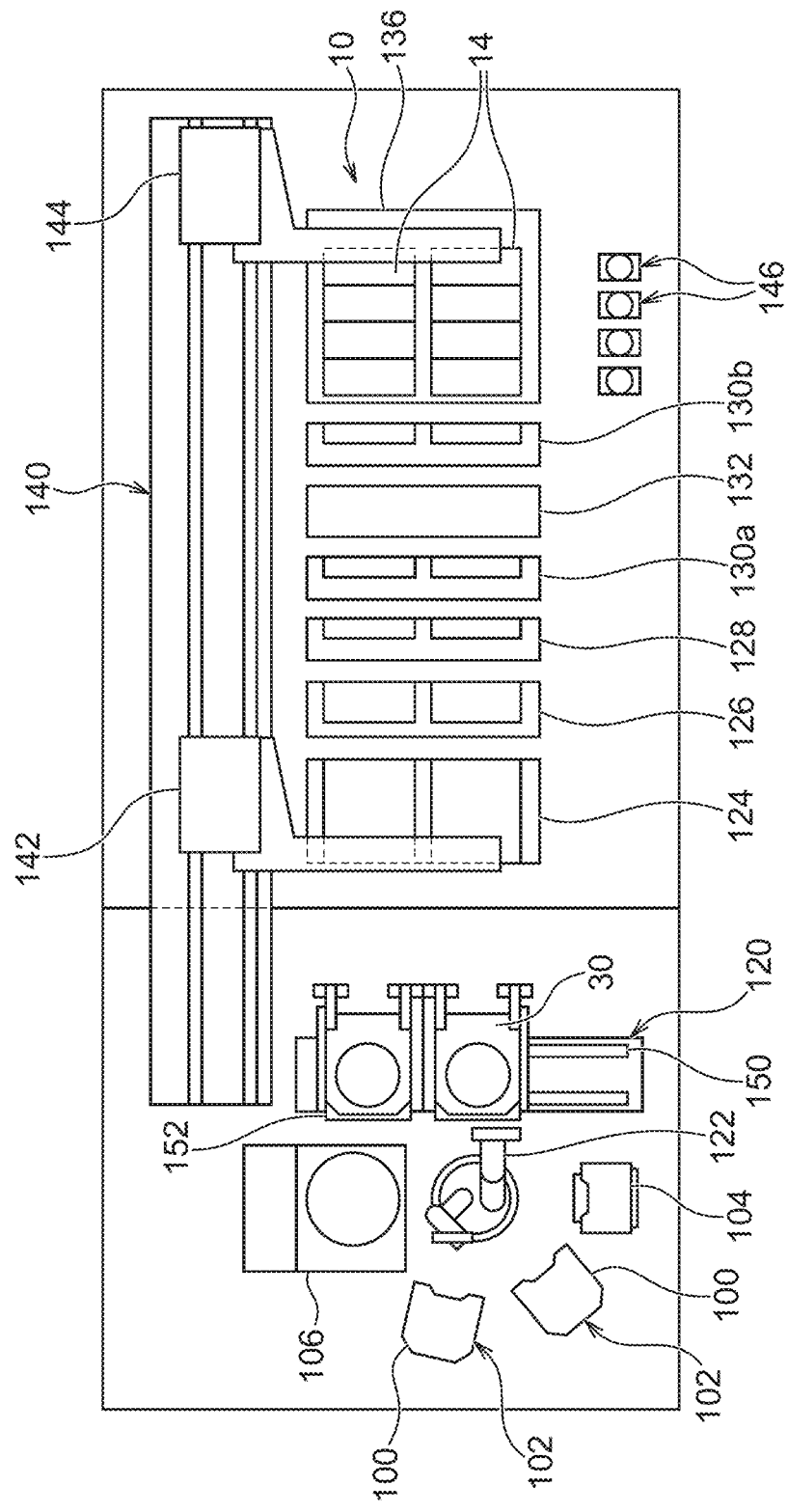
FIG. 1 is an entire disposition diagram of an electrolytic plating apparatus of an embodiment of the present invention.

Hereinafter, an embodiment of the present invention will be described with reference to the drawings. In the drawings described below, the same or corresponding components are assigned with the same reference signs and redundant explanation will be omitted.

FIG. 1 shows an entire disposition diagram of a plating apparatus in the embodiment of the present invention. As shown in FIG. 1, the plating apparatus has two cassette tables 102 which are loaded with cassettes 100 that accommodates substrates such as semiconductor wafers, an aligner 104 that aligns positions of orientation flat, notches and the like of substrates to predetermined directions, and a spin rinse drier 106 that dries substrates after plating treatment by rotating the substrates at a high speed. A substrate attaching and detaching section 120 that has a substrate holder 30 mounted thereon and performs attachment and detachment of substrates is provided near the spin rinse drier 106. In a center of these units 100, 104, 106 and 120, a substrate conveying device 122 which is composed of a conveying robot that conveys substrates to and from these units is disposed.

The substrate attaching and detaching section 120, a stocker 124 that keeps and temporarily stores the substrate holder 30, a pre-wet bath 126 that allows a substrate to be dipped in pure water, a pre-soak bath 128 that removes an oxide film on a surface of a conductive layer such as a seed layer formed on a surface of a substrate by etching, a first cleaning bath 130a that cleans the substrate after pre-soak as well as the substrate holder 30 with a cleaning solution (pure water or the like), a blow bath 132 that dissipates a liquid on the substrate after cleaning, a second cleaning bath 130b that cleans the substrate after plating as well as the substrate holder 30 with a cleaning solution, and a plating unit 10 are disposed in the plating apparatus in this sequence.

The plating unit 10 is configured by accommodating a plurality of plating baths 14 inside an overflow bath 136. Each of the plating baths 14 accommodates a single substrate inside, and dips the substrate in a plating solution that is held inside to apply plating such as copper plating to a substrate surface.

The plating apparatus has a substrate holder conveying device 140 adopting a linear motor method, for example, which is located sideward of the respective devices, and conveys the substrate holder 30 together with a substrate among the respective devices. The substrate holder conveying device 140 has a first transporter 142 that conveys a substrate among the substrate attaching and detaching section 120, the stocker 124, the pre-wet bath 126, the pre-soak bath 128, the first cleaning bath 130a and the blow bath 132, and a second transporter 144 that transports substrates among the first cleaning bath 130a, the second cleaning bath 130b, the blow bath 132 and the plating unit 10. The plating apparatus may include only the first transporter 142, without including the second transporter 144.

At an opposite side of the substrate holder conveying device 140 with the overflow bath 136 interposed in-between, paddle drive devices 146 that drive paddles 16 (refer to FIG. 2) as stirring rods that are located inside the respective plating baths 14 and agitate plating solutions in the plating baths 14 are disposed.

The substrate attaching and detaching section 120 includes a plate-shaped mounting plate 152 that is slidable in a lateral direction along a rail 150. The two substrate holders 30 are mounted on the mounting plate 152 in parallel in a horizontal state, a substrate is transferred between one of the substrate holders 30 and the substrate conveying device 122, after which, the mounting plate 152 is slid in the lateral direction, and transfer of a substrate is performed between the other substrate holder 30 and the substrate conveying device 122.

Figure 2:
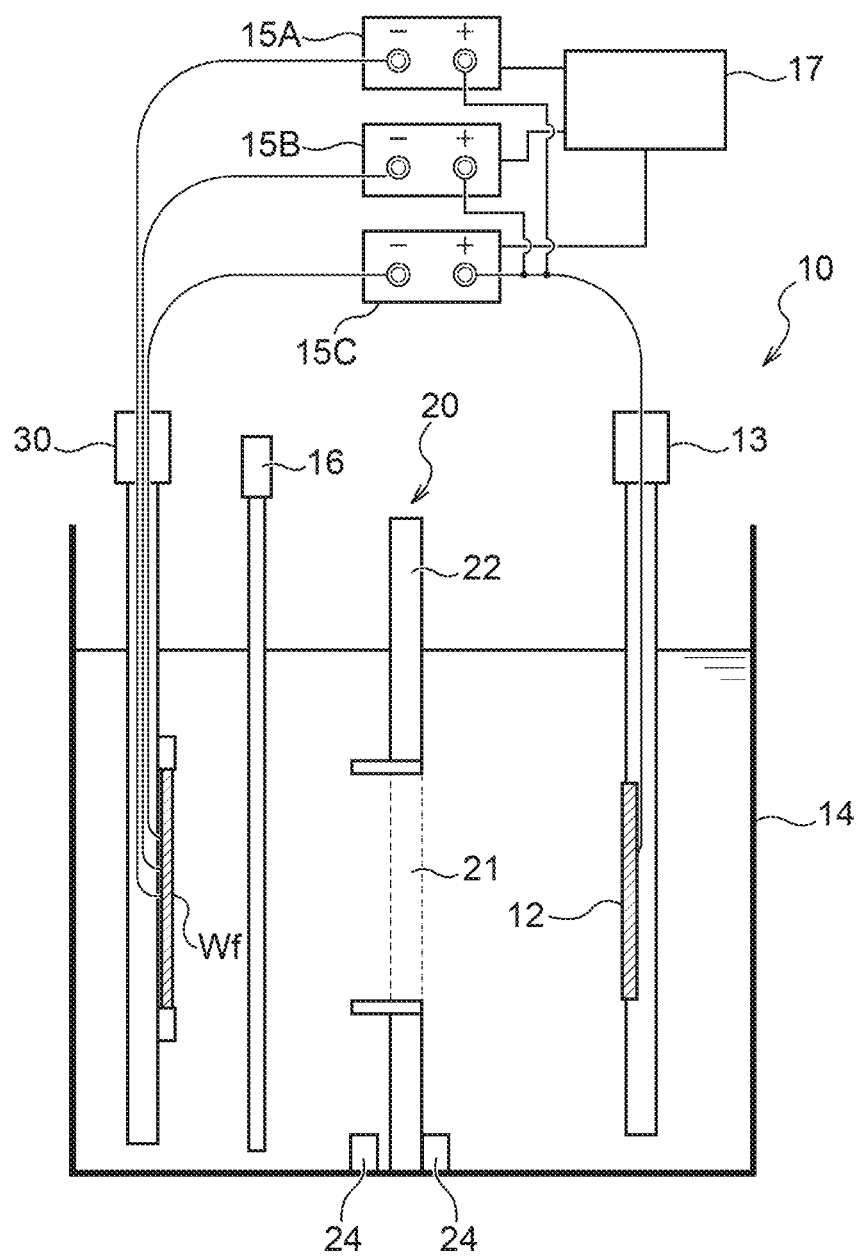
FIG. 2 is a schematic sectional side view (a vertical sectional view) of a plating unit included in the plating apparatus.

FIG. 2 is a schematic sectional side view (a vertical sectional view) of the plating unit included in the plating apparatus shown in FIG. 1. As shown in FIG. 2, the plating unit 10 has the plating bath 14 which is configured to accommodate the plating solution, the substrate holder 30, and an anode holder 13, and the overflow bath (not illustrated). The substrate holder 30 is configured to hold a polygonal substrate Wf, and the anode holder 13 is configured to hold an anode 12 having a metallic surface.

The plating unit 10 further has a plurality (three in the present embodiment) of power supplies 15A, 15B and 15C, and a control device 17 for independently controlling the power supplies 15A, 15B and 15C respectively. The power supplies 15A, 15B and 15C are configured to be electrically connected to the anode 12 and the substrate Wf respectively, and pass electric currents between the anode 12 and the substrate Wf. The control device 17 controls the power supplies 15A, 15B and 14C, and thereby controls currents so that currents of different values are respectively supplied to first power feeding members 41A, 41B and 41C which will be described later and are provided at the substrate holder 30.

The plating unit 10 has a regulation plate 20 for regulating an electric field between the substrate Wf and the anode 12, and the paddle 16 for agitating the plating solution. The regulation plate 20 is disposed between the substrate holder 30 and the anode 12. More specifically, a lower end portion of the regulation plate 20 is inserted between a pair of convex members 24 provided on a floor surface of the plating bath 14, and the regulation plate 20 is fixed to the plating bath 14. The paddle 16 is disposed between the substrate holder 30 and the regulation plate 20.

The regulation plate 20 has an opening 21 corresponding to a shape of the substrate Wf in a substantially central portion. When a voltage is applied to the substrate Wf and the anode 12 in a state where the regulation plate 20 is accommodated in the plating bath 14, a current from the anode 12 passes through the opening 21 and flows to the substrate Wf. In other words, the regulation plate 20 shields a part of an electric field which is formed between the anode 12 and the substrate Wf.

Figure 3:
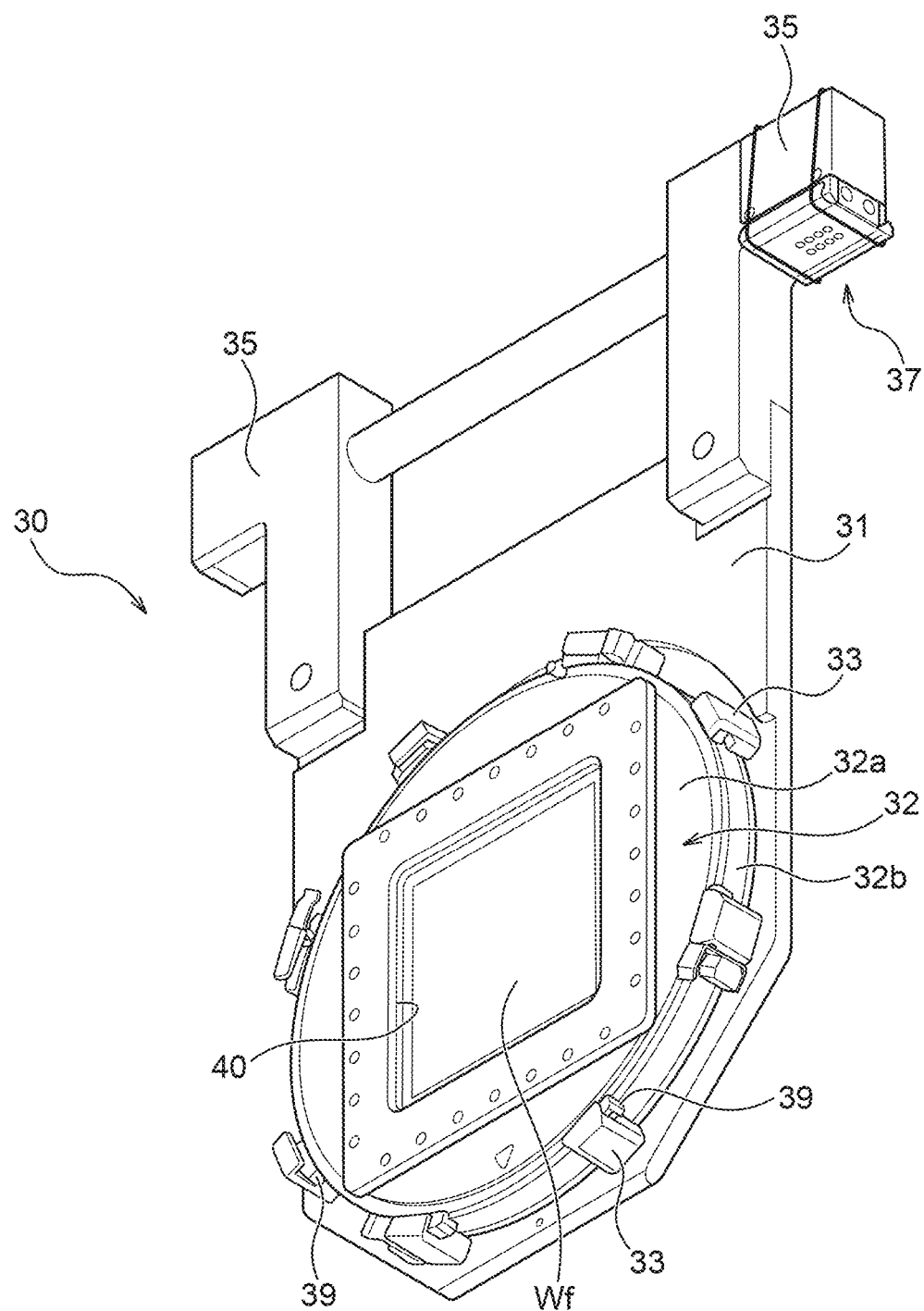
FIG. 3 is a perspective view of a substrate holder according to the present embodiment which is used in the plating unit.
Figure 4:
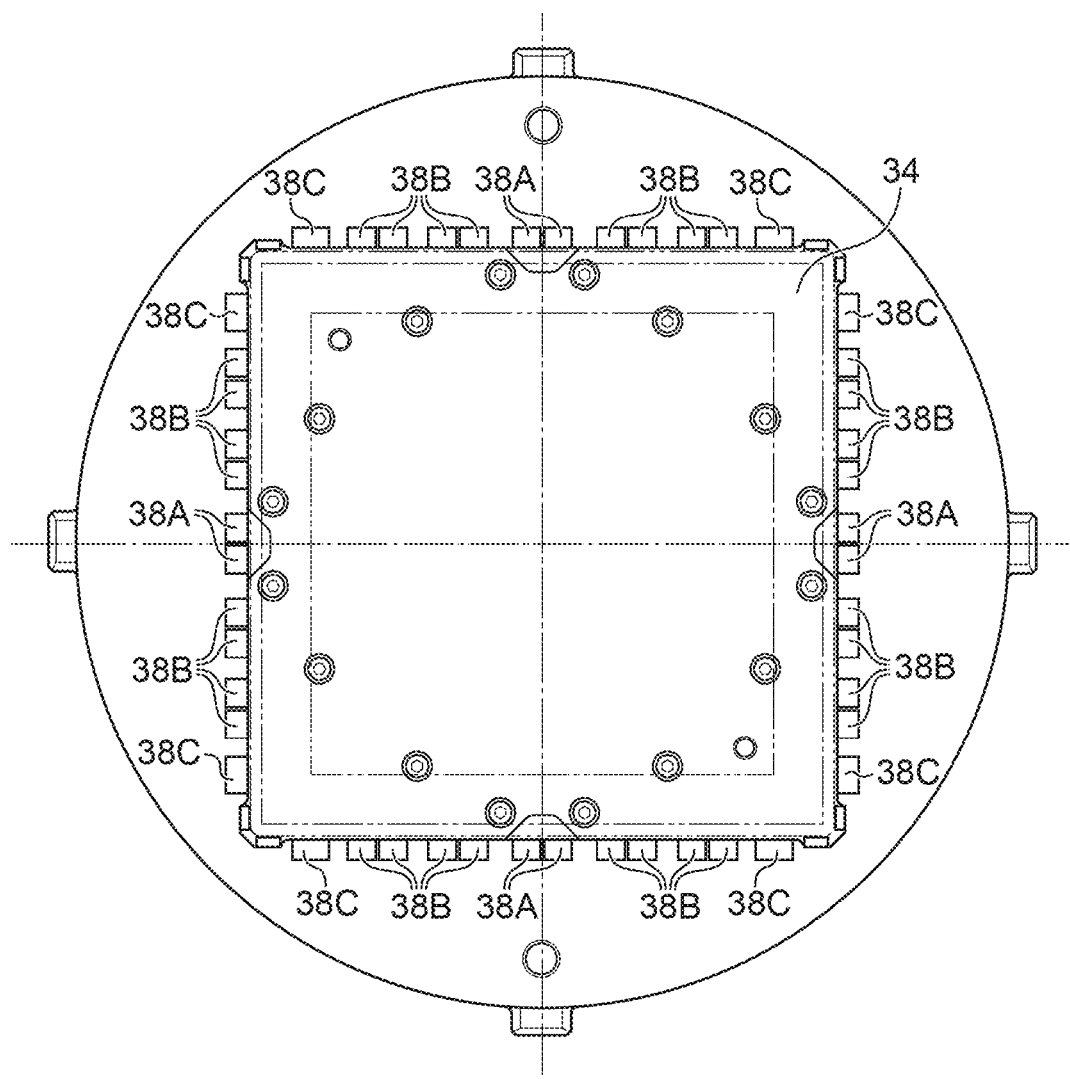
FIG. 4 is a plane view showing a holding surface of the substrate holder.

FIG. 3 is a perspective view of the substrate holder 30 according to the present embodiment which is used in the plating unit 10 shown in FIG. 2, and FIG. 4 is a plan view showing a holding surface of the substrate holder 30. As shown in FIG. 3, the substrate holder 30 has a planar first holding member 31 made of a vinyl chloride, for example, and a second holding member 32 that is attached to the first holding member 31. The second holding member 32 is detachably attached to the first holding member 31 in such a manner as to press the substrate Wf to the first holding member 31.

In a substantially central portion of the first holding member 31 of the substrate holder 30, a holding surface 34 (corresponding to an example of a substrate holding surface) for mounting and holding the substrate Wf (a quadrangle in the illustrated example) is provided (refer to FIG. 4). That is, when the second holding member 32 shown in FIG. 3 is detached from the first holding member 31, and the substrate Wf is detached, the holding surface 34 appears as a part of the first holding member 31. Around the holding surface 34 of the first holding member 31, clampers 33 in an inverted L-shape having protruded portions protruding inward are equidistantly provided circumferentially.

To an end portion of the first holding member 31 of the substrate holder 30, a pair of substantially L-shaped arms 35 to be support portions when the substrate holder 30 is conveyed, and suspended and supported are connected. For example, in the stocker 124 shown in FIG. 1, the arms 35 are hooked on a top surface of a peripheral wall of the stocker 124, whereby the substrate holder 30 is vertically suspended and supported. Further, the arms 35 of the substrate holder 30 which is suspended and supported are grasped with the first transporter 142 or the second transporter 144 of the substrate holder conveying device 140 and the substrate holder 30 is conveyed. In the pre-wet bath 126, the pre-soak bath 128, the cleaning baths 130a and 130b, the blow bath 132 and the plating bath 134, the substrate holder 30 is suspended and supported on circumferential walls thereof via the arms 35.

Further, at one of the arms 35, an external contact section 37 that is electrically connected to the power supplies 15A, 15B and 15C shown in FIG. 1 is provided. The external contact section 37 is electrically connected to a plurality of conductors 38A, 38B and 38C (refer to FIG. 4) which are provided at an outer perimeter of the holding surface 34 via a plurality of connection units that will be described later.

The second holding member 32 has a seal holder 32a having a substantially quadrangular opening 40 on which the substrate Wf is exposed. A presser ring 32b for pressing and fixing the seal holder 32a to the first holding member 31 is rotatably fitted to an outer circumferential portion of the seal holder 32a. The presser ring 32b has a plurality of ridge portions 39 that protrude outward in an outer circumferential portion thereof. A top surface of the ridge portion 39 and an undersurface of an inward protruding portion of the clamper 33 have taper surfaces which incline in opposite directions to each other along a rotational direction.

When a substrate is held, the substrate Wf is mounted on the holding surface 34 (refer to FIG. 4) of the first holding member 31 first in a state where the second holding member 32 is detached, and the second holding member 32 is fitted to the first holding member 31. Subsequently, the presser ring 32b is rotated clockwise, and the ridge portions 39 of the presser ring 32b are slid to insides (lower sides) of the inward protruding portions of the clampers 33. Thereby, the first holding member 31 and the second holding member 32 are fastened to each other and locked via the taper surfaces which are respectively provided on the ridge portions 39 and the clampers 33, and the substrate Wf is held. When holding of the substrate Wf is released, the presser ring 32b is rotated counterclockwise in a state where the first holding member 31 and the second holding member 32 are locked. Thereby, the ridge portions 39 of the presser ring 32b are detached from the clampers 33 in the inverted L-shapes, and holding of the substrate Wf is released.

Figure 5:
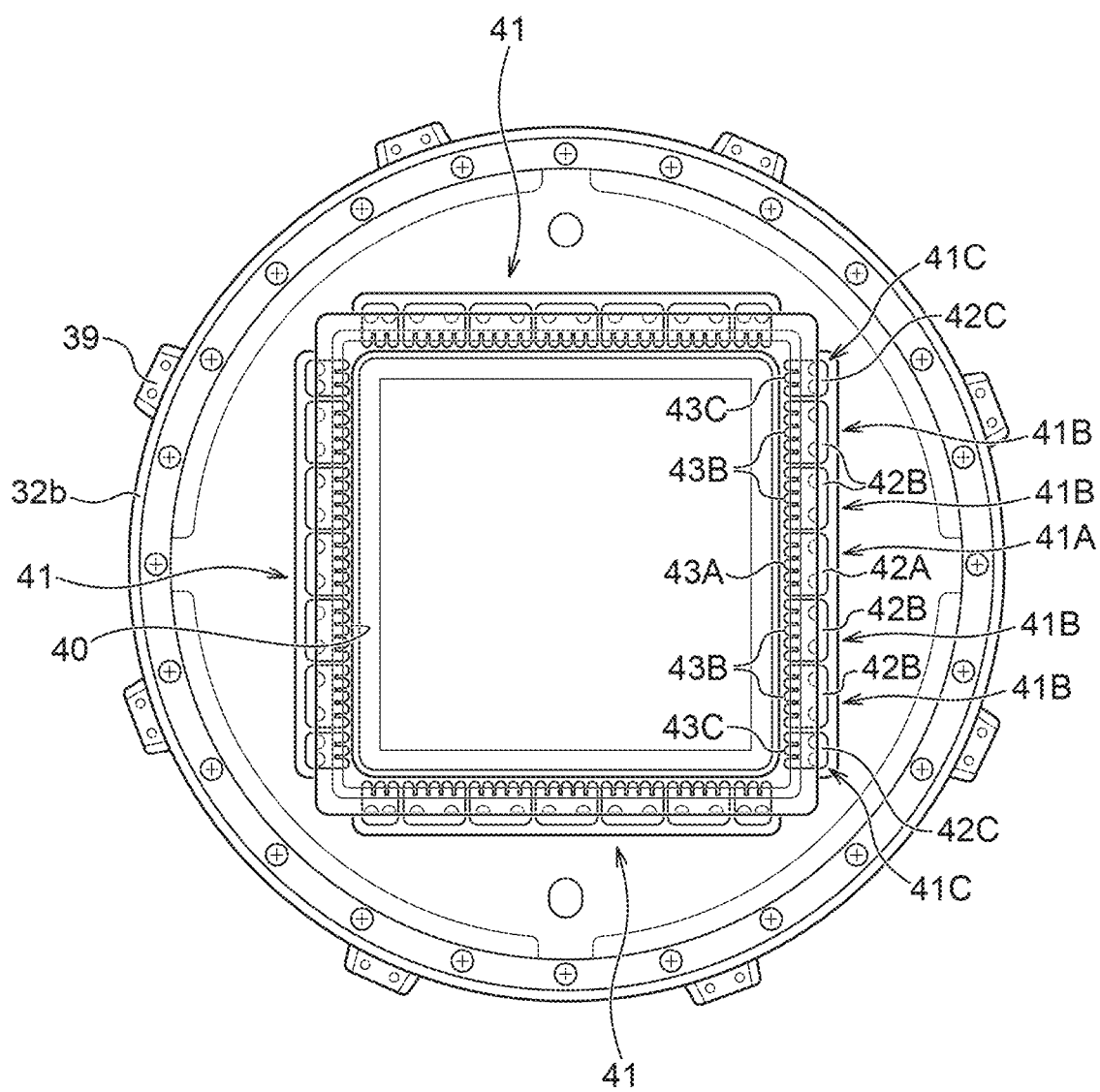
FIG. 5 is a front view of a back surface side of a second holding member.

Next, the second holding member 32 shown in FIG. 3 will be described in detail. FIG. 5 is a front view of a back surface side of the second holding member 32. Here, the back surface side means a back surface side when a surface of the second holding member 32 shown in FIG. 3 is set as a front surface side. As shown in FIG. 5, the second holding member 32 has a plurality of power feeding members 41 which are disposed along a perimeter of the opening 40. When the second holding member 32 is fitted to the first holding member 31, the opening 40 is disposed to substantially correspond to respective sides of the substrate Wf, and therefore, at this time, the power feeding members 41 are disposed on the substrate Wf along the respective sides of the substrate Wf.

The power feeding member 41 includes a first power feeding member 41A capable of contacting a side central region including a central portion of a side of the substrate Wf, second power feeding members 41B capable of contacting intermediate regions adjacent to the side central region, and third power feeding members 41C capable of contacting corner regions closer to corner portions of the substrate Wf than the intermediate regions. The first power feeding member 41A has a first leg portion 42A that is configured to contact the conductor 38A shown in FIG. 4, and a first contact section 43A that is configured to contact the side central region of the substrate Wf. The second power feeding member 41B has a second leg portion 42B that is configured to contact the conductor 38B shown in FIG. 4, and a second contact section 43B that is configured to contact the intermediate region of the substrate Wf. The third power feeding member 41C has a third leg portion 42C that is configured to contact the conductor 38C shown in FIG. 4, and a third contact section 43C that is configured to contact the corner region of the substrate Wf. Since the substrate holder 30 according to the present embodiment is configured to hold the polygonal substrate Wf, the first contact sections 43A, the second contact sections 43B and the third contact sections 43C are aligned in a substantially straight line along the respective sides of the substrate Wf.

Electric currents are supplied to the first power feeding members 41A, the second power feeding members 41B and the third power feeding members 41C from the power supplies 15A, 15B and 15C shown in FIG. 1 via the external contact section 37 shown in FIG. 3, the plurality of connection units which will be described later, and the plurality of conductors 38A, 38B and 38C shown in FIG. 4. The electric currents which are respectively supplied to the first power feeding members 41A, the second power feeding members 41B and the third power feeding members 41C are respectively supplied to the substrate Wf from the first contact sections 43A, the second contact sections 43B and the third contact sections 43C.

While the third power feeding member 41C is configured to contact the corner region of the substrate Wf, the third power feeding member 41C does not contact a corner (a point of intersection of sides) of the substrate Wf. More preferably, the third power feeding member 41C is disposed not to contact a vicinity of the corner (the point of intersection of sides) of the substrate Wf. Here, the vicinity of the corner of the substrate Wf refers to regions where electric fields readily concentrate shown in FIG. 21A to FIG. 21D, and refers to a region in a range within a length of 20% of a length of a single side from the corner (the point of intersection of sides), for example. More specifically, the vicinity of the corner sometimes refers to a range of approximately 1.5 cm from the corner (the point of intersection of sides) of the substrate Wf, or sometimes refers to a range of approximately 1.0 cm. As explaining in relation to FIG. 21A to FIG. 21D, an electric field tend to concentrate on the vicinities of the corner portions of the polygonal substrate Wf. Consequently, in the substrate holder 30 of the present embodiment, the third power feeding member 41C is configured to contact a region other than the corner of the substrate Wf, whereby a current can be made difficult to flow in the region where the electric field readily concentrates. With respect to the range within the length corresponding to 20% of the length of the single side of the substrate Wf from the corner of the substrate Wf, a region where the substrate Wf and the power feeding member 41 do not contact each other is preferably provided. Here, when the region where the power feeding member 41 does not contact the substrate Wf is set as the region beyond 20% from the corner, that is, when the distance to the contact portion of the power feeding member 41 and the substrate Wf from the corner becomes too long, concentration of the electric field in the vicinity of the corner portion is relieved, and therefore, concentration of the plating film thickness in the vicinity of the corner portion is reduced. Meanwhile, in this case, the plating film thickness in the side central region is increased, and therefore, there arises the fear of being incapable of ensuring uniformity of the plating film thickness.

Figure 6:
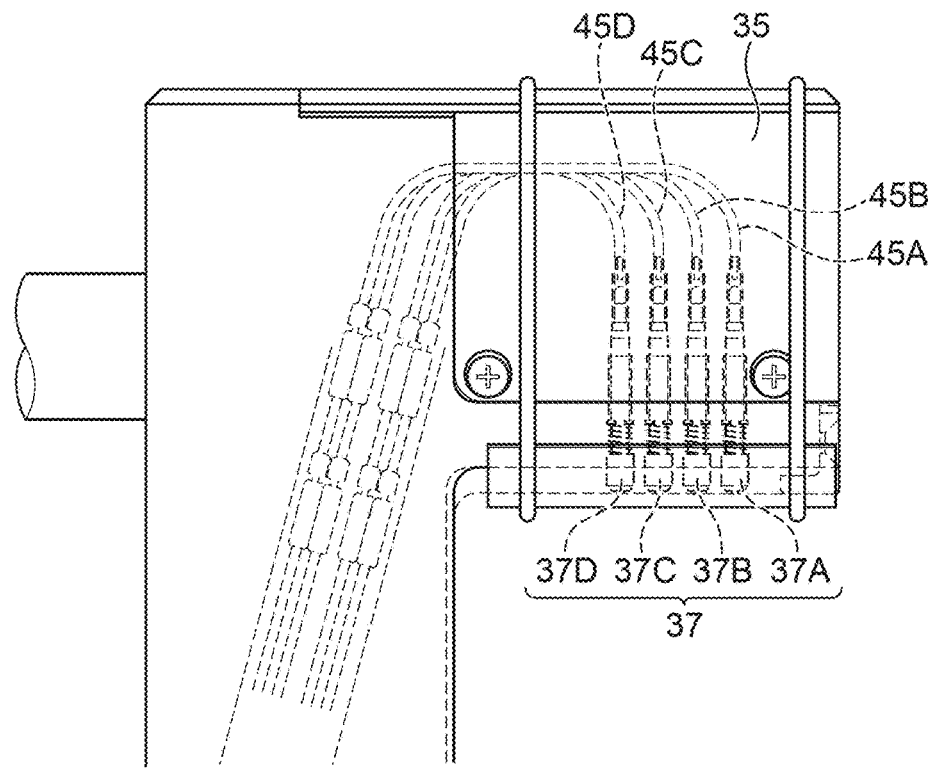
FIG. 6 is a front view of an external contact section provided at the substrate holder.

Next, the external contact section 37 shown in FIG. 3 will be described in detail. FIG. 6 is a front view of the external contact section 37 provided at the substrate holder 30. In FIG. 6, a vicinity of the arm 35 of the substrate holder 30 is enlarged, and the arm 35 is shown transparently. The external contact section 37 at the substrate holder 30 has a pair of first external contact sections 37A and 37A, a pair of second external contact sections 37B and 37B, a pair of third external contact sections 37C and 37C, and a pair of fourth external contact sections 37D and 37D. In FIG. 6, of the respective external contact sections 37, only one is shown. The first external contact section 37A, the second external contact section 37B, the third external contact section 37C, and the fourth external contact section 37D are electrically independent from one another, and different currents can be caused to flow to the external contact sections 37A, 37B, 37C and 37D.

The substrate holder 30 has a pair of first contact wirings 45A and 45A that are connected respectively to the first external contact sections 37A and 37A, a pair of second contact wirings 45B and 45B that are connected respectively to the second external contact sections 37B and 37B, a pair of third contact wirings 45C and 45C that are connected respectively to the third external contact sections 37C and 37C, and a pair of fourth contact wirings 45D and 45D that are connected respectively to the fourth external contact sections 37D and 37D. In FIG. 6, only one of each of the respective pairs of contact wirings is shown. The first contact wiring 45A, the second contact wiring 45B, the third contact wiring 45C and the fourth contact wiring 45D are electrically independent from one another, and different currents can be respectively passed to the first to the fourth contact wirings.

Figure 7:
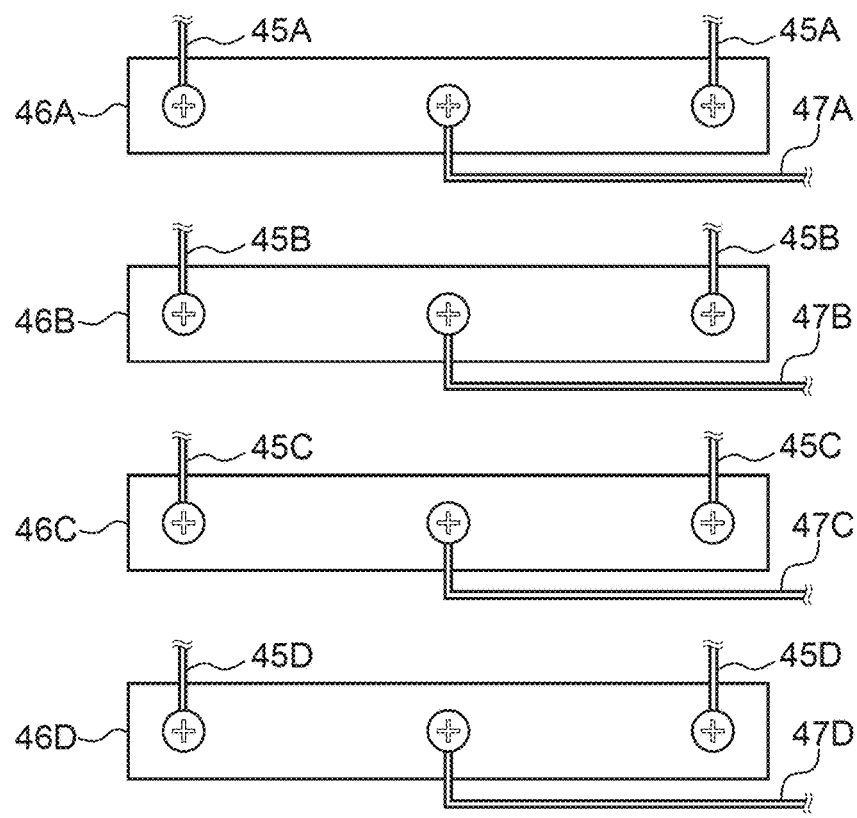
FIG. 7 is a plane view showing plates that are provided inside the holding surface.

FIG. 7 is a plan view showing plates that are provided inside the holding surface 34 shown in FIG. 4. The substrate holder 30 has a first plate 46A which is connected to the pair of first contact wirings 45A, a second plate 46B which is connected to the pair of second contact wirings 45B, a third plate 46C which is connected to the pair of third contact wirings 45C, and a fourth plate 46D which is connected to the pair of fourth contact wirings 45D. The first plate 46A, the second plate 46B, the third plate 46C and the fourth plate 46D are electrically independent from one another, and different currents can be passed respectively to these plates.

A first power feeding wiring 47A which electrically connects the first plate 46A and the first power feeding member 41A via the conductor 38A shown in FIG. 4 is connected to the first plate 46A. A second power feeding wiring 47B which electrically connects the second plate 46B and the second power feeding member 41B via the conductor 38B shown in FIG. 4 is connected to the second plate 46B. A third power feeding wiring 47C which electrically connects the third plate 46C and the third power feeding member 41C via the conductor 38C shown in FIG. 4 is connected to the third plate 46C. A fourth power feeding wiring 47D is connected to the fourth plate 46D. In the present embodiment, the fourth external contact sections 37D and 37D, the fourth contact wirings 45D and 45D, the fourth plate 46D and the fourth power feeding wiring 47D are spare current supply means, and are not configured to supply a current to the substrate. In accordance with necessity, the fourth power feeding wiring 47D can be connected to any of the power feeding members 41. The first power feeding wiring 47A, the second power feeding wiring 47B, the third power feeding wiring 47C and the fourth power feeding wiring 47D are electrically independent from one another, and different currents can be passed respectively to these power feeding wirings.

The first contact wirings 45A, the first plate 46A and the first power feeding wiring 47A which are shown in FIG. 6 and FIG. 7 configure a first connection unit that electrically connects the first external contact sections 37A and the first power feeding member 41A. Further, the second contact wirings 45B, the second plate 46B and the second power feeding wiring 47B configure a second connection unit that electrically connects the second external contact sections 37B and the second power feeding member 41B. Similarly, the third contact wirings 45C, the third plate 46C and the third power feeding wiring 47C configure a third contact unit that electrically connects the third external contact sections 37C and the third power feeding member 41C. The respective connection units are electrically independent from one another, and different currents can be passed respectively to the connection units.

As shown in FIG. 7, the two first contact wirings 45A are connected to the first plate 46A. Thereby, even when a difference in electric resistance is present between the two first external contact sections 37A and 37A, currents from the two first contact wirings 45A flow to the single first plate 46A, so that a difference of current values of the two first contact wirings 45A due to the difference in the electric resistance can be eliminated. The second plate 46B, the third plate 46C and the fourth plate 46D also have similar effects.

In the embodiment shown in FIG. 7, only the single first power feeding wirings 47A, the single second power feeding wiring 47B, the single third power feeding wiring 47C and the single fourth power feeding wiring 47D are illustrated respectively. However, the present invention is not limited to this, and the number of wirings can be properly increased, or the wirings can be branched, in accordance with the number of power feeding members 41.

As described above, since the first contact sections 43A, the second contact sections 43B, and the third contact sections 43C are aligned in a substantially straight line along the sides of the substrate Wf, the substrate holder 30 according to the present embodiment holds the polygonal substrate Wf and can supply currents to the substrate Wf.

Further, the substrate holder 30 can supply currents of different values respectively to the first power feeding members 41A, the second power feeding members 41B, and the third power feeding members 41C from the external contact section 37 via the first connection unit, the second connection unit and the third connection unit. Consequently, as described later, currents of different values can be passed to the side central regions, the intermediate regions and the corner regions of the substrate Wf, in accordance with an ununiform terminal effect which occurs to the peripheral portion of the substrate Wf, and in-plane uniformity of the thickness of the film which is formed on the substrate Wf can be enhanced.

The substrate holder 30 has the pair of first external contact sections 37A and 37A, the pair of second external contact sections 37B and 37B, the pair of third external contact sections 37C and 37C and the pair of fourth external contact sections 37D and 37D, but the substrate holder 30 is not limited to this. For example, one of the respective external contact sections 37 may be provided. Further, the substrate holder 30 may be configured to have at least only one optional external contact section, of the first external contact section 37A, the second external contact section 37B, the third external contact section 37C and the fourth external contact section 37D. Similarly, the substrate holder 30 may be configured to have at least one optional connection unit of the first connection unit, the second connection unit and the third connection unit.

Figure 8:
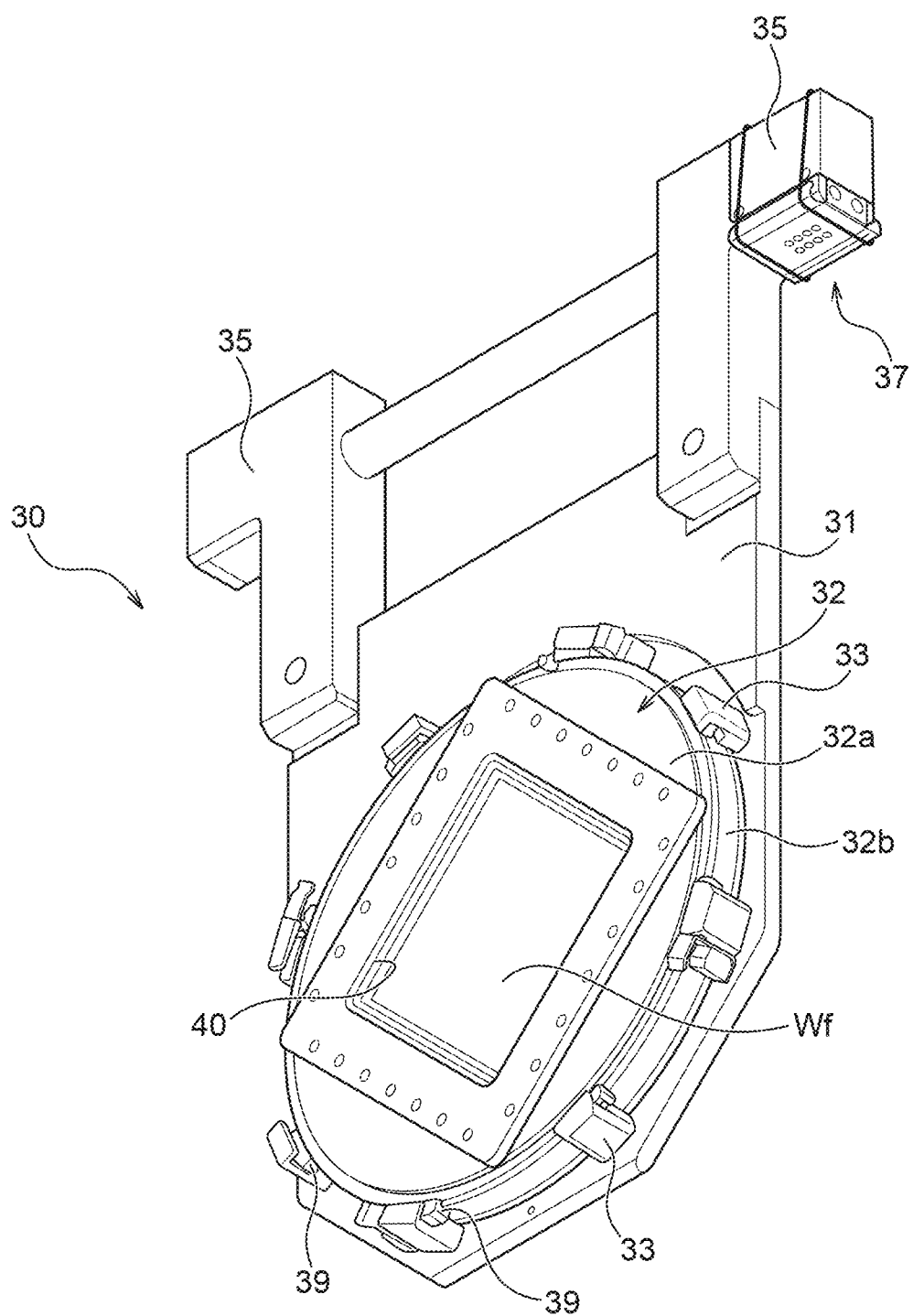
FIG. 8 is a perspective view showing another embodiment of the substrate holder.

FIG. 8 is a perspective view showing another embodiment of the substrate holder 30. The illustrated substrate holder 30 differs in orientation of the substrate Wf which is held, as compared with the substrate holder 30 shown in FIG. 3. As illustrated, the substrate holder 30 holds the substrate Wf so that the corner of the substrate Wf is located at a vertically lower position in a state in which the substrate holder 30 is suspended at the plating bath 14 shown in FIG. 2. Thereby, when the substrate holder 30 is raised from the plating bath 14, the plating solution adhering to the substrate Wf and the like moves downward along the edge of the substantially quadrangular opening 40, and the plating solution can be drained quickly from the lower corner portion of the opening 40. Accordingly, when the substrate holder 30 is raised from the plating bath 14 and is conveyed to the next step, the plating solution can be drained quickly over the plating bath 14, and therefore, occurrence of the problem of dripping or the like can be prevented.

Next, a process of plating the substrate Wf in the plating unit 10 shown in FIG. 2 will be described. As is described in relation to FIG. 21A to FIG. 21D, an ununiform terminal effect occurs along the peripheral portion, in the polygonal substrate Wf. Consequently, in the plating apparatus of the present invention, the substrate holder 30 having the plurality of power feeding members 41 which are disposed along the respective sides of the polygonal substrate is used, and the control device 17 is configured to simultaneously supply currents of at least two different values to the different power feeding members of the plurality of power feeding members 41. Thereby, the currents of suitable values can be passed to the peripheral portion of the polygonal substrate Wf in accordance with the ununiform terminal effect of the polygonal substrate Wf. As a plurality of processes that will be described below, a process that simultaneously passes currents of three different values to the substrate Wf (FIG. 9 to FIG. 14), and a process of simultaneously passing currents of two different values to the substrate Wf (FIG. 15 to FIG. 20) are illustratively described. However, the plating device of the present invention also can simultaneously pass currents of four or more different values to the substrate Wf, without being limited to these examples. In this case, the numbers of power supplies for passing currents to the electric contacts, the external contact sections 37 and connection units (the contact wirings, plates and power feeding wirings) can be properly adjusted. In this way, the currents of different values are locally passed to the substrate Wf simultaneously in accordance with the ununiform terminal effect, whereby the in-plane uniformity of the film thickness can be enhanced.

Figure 9:
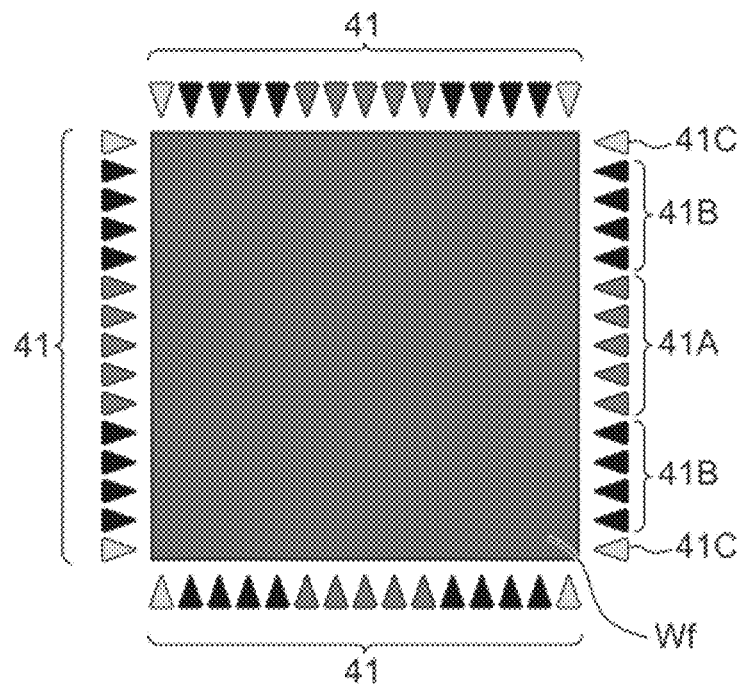
FIG. 9 is a schematic diagram showing a positional relation of a substrate and power feeding members.

FIG. 9 is a schematic view showing a positional relation of the substrate Wf and the power feeding members 41. In the example shown in FIG. 9, the substrate Wf is a quadrangle, and the power feeding members 41 are disposed along the four sides. As described in relation to FIG. 5, the power feeding members 41 include the first power feeding members 41A which are capable of contacting the side central regions including the central portions of the sides of the substrate Wf, the second power feeding members 41B which are capable of contacting the intermediate regions adjacent to the side central regions, and the third power feeding members 41C which are capable of contacting the corner regions which are closer to the corner portions of the substrate Wf than the intermediate regions.

The first power feeding member 41A is electrically connected to the power supply 15A shown in FIG. 2, and a voltage is applied to the first power feeding member 41A by the power supply 15A. Here, a circuit including the first power feeding member 41A and the power supply 15A is referred to as a circuit A. The second power feeding member 41B is electrically connected to the power supply 15B shown in FIG. 2, and a voltage is applied to the second power feeding member 41B by the power supply 15B. Here, a circuit including the second power feeding member 41B and the power supply 15B is referred to as a circuit B. The third power feeding member 41C is electrically connected to the power supply 15C shown in FIG. 2, and a voltage is applied to the third power feeding member 41C by the power supply 15C. Here, a circuit including the third power feeding member 41C and the power supply 15C is referred to as a circuit C.

Next, a recipe example of currents which are passed to the circuit A, the circuit B and the circuit C by the power supplies 15A, 15B and 15C will be described. FIG. 10 to FIG. 14 are graphs showing recipe examples of the currents which flow to the circuit A, the circuit B and the circuit C. In each of the graphs, a horizontal axis represents a plating time period (%), and a vertical axis represents an average current value (A) per one contact. The power supplies 15A, 15B and 15C are controlled by the control device 17 shown in FIG. 2 so that the currents shown in FIG. 10 to FIG. 14 flow to the circuit A, the circuit B and the circuit C.

Figure 10:
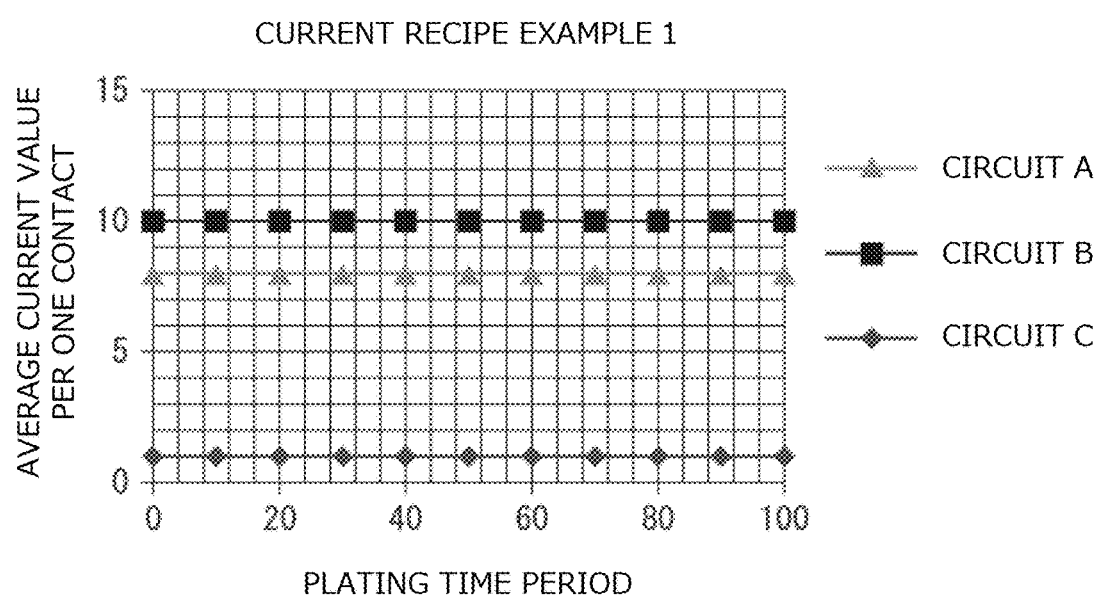
FIG. 10 is a graph showing a recipe example of currents which flow in a circuit A, a circuit B and a circuit C.

In an example shown in FIG. 10, a constant current of approximately 8 A flows to the circuit A, a constant current of approximately 10 A flows to the circuit B, and a constant current of approximately 1 A flows to the circuit C, throughout the entire plating process. That is, the power supplies 15A, 15B and 15C are controlled so that currents of different values respectively flow to the circuit A, the circuit B and the circuit C.

Figure 21A:
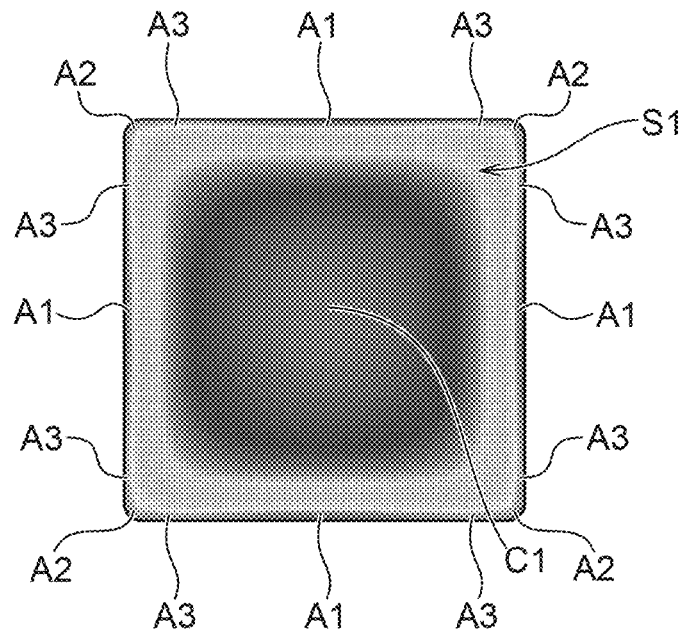
FIG. 21A is a schematic view showing a change of a current density distribution accompanying advance of plating, when plating is applied to a quadrangular substrate which is an example of a polygonal substrate.
Figure 21B:
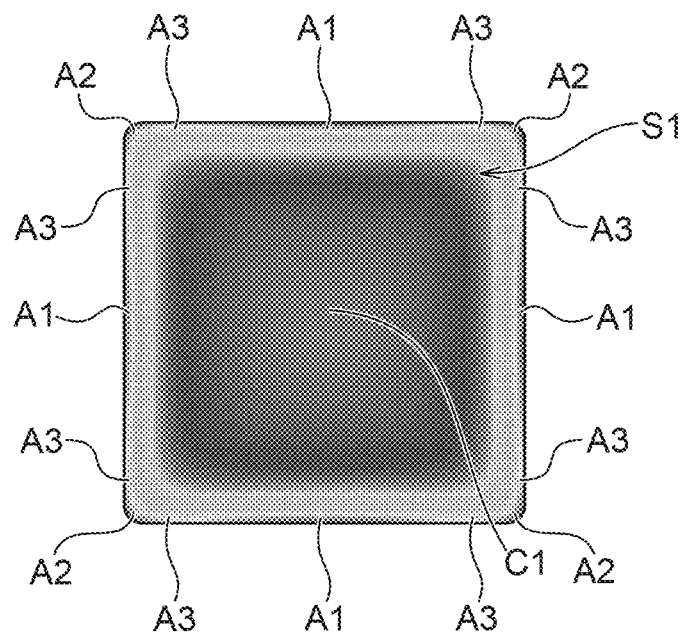
FIG. 21B is a schematic view showing a change of the current density distribution accompanying advance of plating, when plating is applied to the quadrangular substrate which is an example of a polygonal substrate.
Figure 21C:
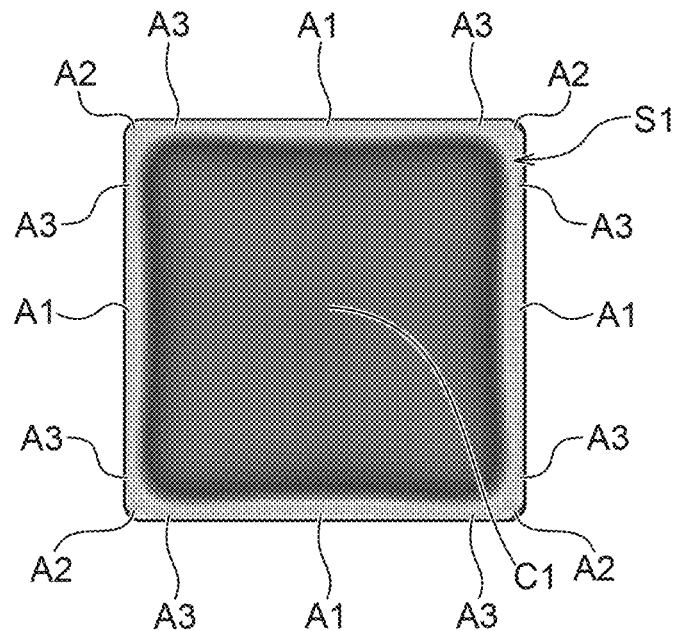
FIG. 21C is a schematic view showing a change of the current density distribution accompanying advance of plating, when plating is applied to the quadrangular substrate which is an example of a polygonal substrate.
Figure 21D:
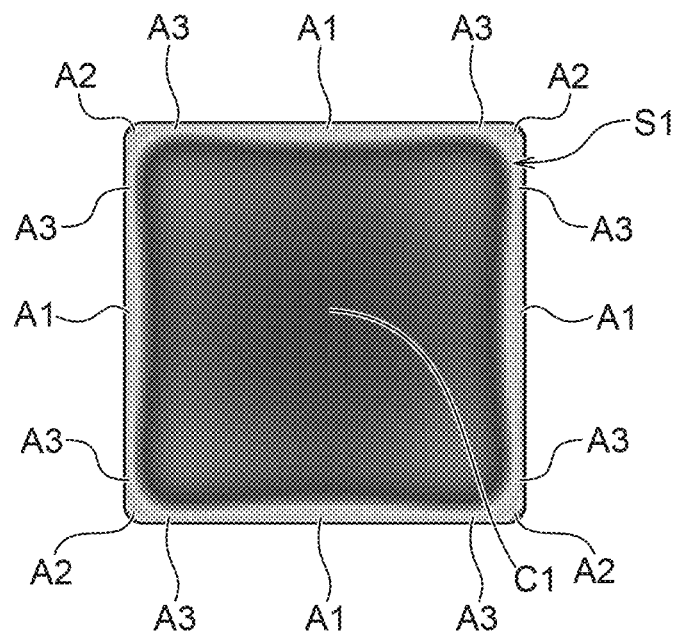
FIG. 21D is a schematic view showing a change of the current density distribution accompanying advance of plating, when plating is applied to the quadrangular substrate which is an example of a polygonal substrate.

As described in relation to FIG. 21A to FIG. 21C, in the side central regions A1 of the substrate Wf, due to the terminal effect, in the side central region A1 of the quadrangular substrate S1, an electric field concentrates at the initial stage of plating, and the current density becomes smaller as plating advances. In relation to this, in the intermediate regions A3 of the quadrangular substrate S1, the current density is smaller than in the side central regions A1 at the initial stage of plating, and as plating advances, the difference between the intermediate regions A3 and the side central regions A1 becomes smaller. Accordingly, the side central regions A1 tend to have a larger film thickness of plating than the intermediate regions A3. Meanwhile, on the corner regions A2 of the quadrangular substrate S1, the electric field continues to concentrate until an end time from the initial stage of plating. Consequently, the corner regions A2 tend to have a larger film thickness as compared with the side central regions A1 and the intermediate regions A3.

Consequently, in the example shown in FIG. 10, a value of a current which is supplied to the third power feeding member 41C (the circuit C) which contacts the corner region which tends to have the largest film thickness is made smaller as compared with the values of the currents which are supplied to the other circuits. Meanwhile, a value of a current which is supplied to the first power feeding member 41A (the circuit A) which contacts the side central region on which the electric field more readily concentrates than on the intermediate region is made smaller as compared with the value of the current which is supplied to the circuit B. In other words, a value of a current which is supplied to the second power feeding member 41B (the circuit B) which contacts the intermediate region on which the electric field is the most difficult to concentrate of the peripheral portion of the substrate Wf is made larger than the values of the currents which are supplied to the other circuits.

By controlling the power supplies 15A, 15B and 15C as shown in FIG. 10, reduction of the in-plane uniformity of the film thickness which occurs due to ununiformity of the electric field which is caused by the terminal effect of the polygonal substrate Wf and/or the plating bath structure is compensated, and the in-plane uniformity of the film thickness can be enhanced.

Figure 11:
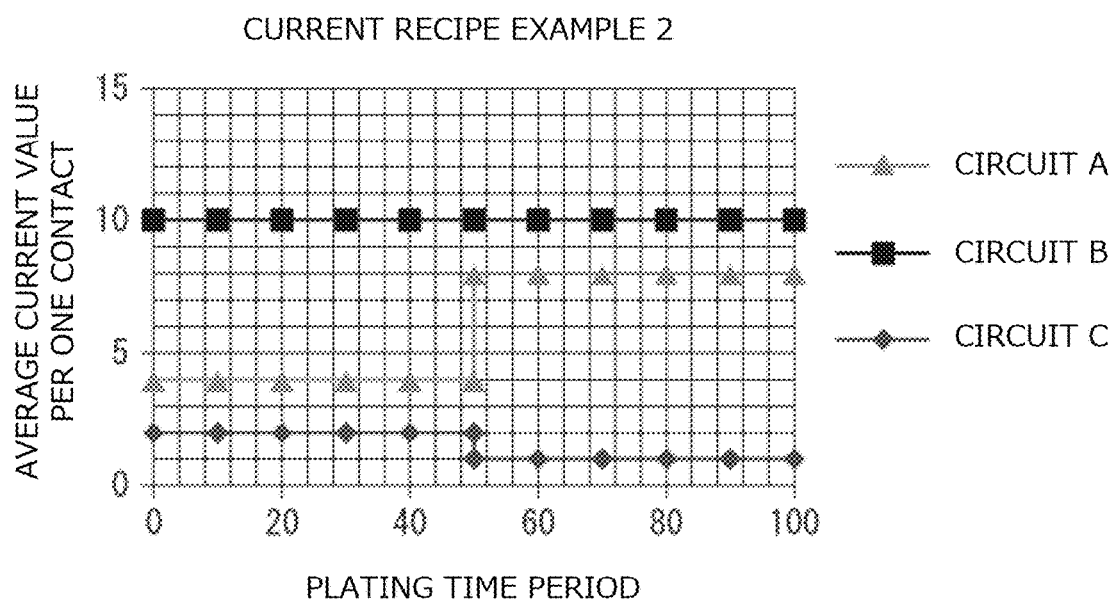
FIG. 11 is a graph showing a recipe example of currents which flow in the circuit A, the circuit B and the circuit C.

In an example shown in FIG. 11, in the circuit A, a current of approximately 4 A flows up to 50% of a plating time period, and a current of approximately 8 A flows from 50% of the plating time period. In the circuit B, a current of approximately 10 A flows throughout the entire plating process. In the circuit C, a current of approximately 2 A flows up to 50% of the plating time period, and a current of approximately 1 A flows from 50% of the plating time period. In FIG. 11, timings for switching the currents of the respective circuits are set at 50% of the plating time period, but other numeric values such as 40% of the plating time period or 60% of the plating time period can be also selected, for example. Here, "the plating time period" refers to a numeric value (unit: %) that is calculated by (plating time period)=100×(elapsed time)/(time period required until plating is completed). Accordingly, 50% of the plating time period refers to a point of time at which a half of the time period elapses, of the time period which is required until plating is completed.

The example shown in FIG. 11 differs from the example shown in FIG. 10 in a point that the values of the currents which flow to the circuit A and the circuit C are changed halfway through plating. That is, the value of the current which flows to the circuit A is increased stepwise halfway through the plating. As described in relation to FIG. 21A to FIG. 21C, in the side central regions A1 of the substrate, due to the terminal effect, in the side central regions A1 of the quadrangular substrate S1, the electric field concentrates at the initial stage of plating, and the current density becomes smaller as plating advances. Consequently, at the initial stage of the plating when the electric field concentrates, the value of the current is made relatively small, and the value of the current is made relatively large at a middle stage of the plating at which the current density becomes small. In this way, the current value is changed in accordance with the terminal effect, and therefore, the in-plane uniformity of the film thickness can be more enhanced as compared with the example of FIG. 10 in which a constant current continues to be passed.

Further, in the example shown in FIG. 11, the value of the current which flows in the circuit C is decreased halfway through plating. As described in relation to FIG. 21A to FIG. 21C, in the corner region A2 of the substrate, an electric field continues to concentrate consistently from the initial stage of plating to the end time, but concentration of the electric field is somewhat small at the initial stage of plating. Consequently, at the initial stage of plating, the value of the current is made relatively large, and the value of the current is made relatively small at the middle stage of the plating at which concentration of the electric field becomes large. In this way, the current value is changed in accordance with the change of the terminal effect, and therefore, the in-plane uniformity of the film thickness can be more enhanced as compared with the example of FIG. 10 in which a constant current continues to be passed.

Figure 12:
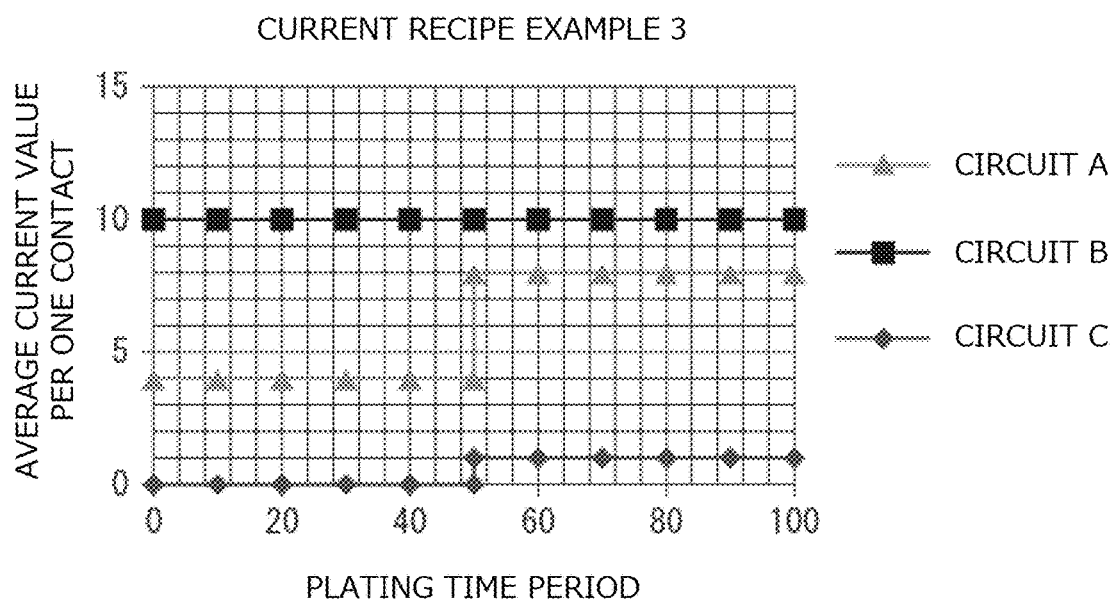
FIG. 12 is a graph showing a recipe example of currents which flow in the circuit A, the circuit B and the circuit C.

In an example shown in FIG. 12, in the circuit A, a current of approximately 4 A flows up to 50% of the plating time period, and a current of approximately 8 A flows from 50% of the plating time period. In the circuit B, a current of approximately 10 A flows throughout the entire plating process. In the circuit C, a current of 0 A flows up to 50% of the plating time period, and a current of approximately 1 A flows from 50% of the plating time period.

The example shown in FIG. 12 differs from the example shown in FIG. 11 in a point that no current flows in the circuit C until 50% of the plating time period. As described in relation to FIG. 21A to FIG. 21C, the corner regions A2 of the substrate tend to have a larger film thickness as compared with the side central regions A1 and the intermediate regions A3. Consequently, in the example shown in FIG. 12, increase of the film thickness of the corner regions A2 can be restrained by providing the time period in which no current flows in the circuit C in the plating process. In FIG. 12, a timing for switching the current in the circuit is set as the 50% of the plating time period, but other numeric values such as 40% of the plating time period or 60% of the plating time period also can be selected, for example.

Figure 13:
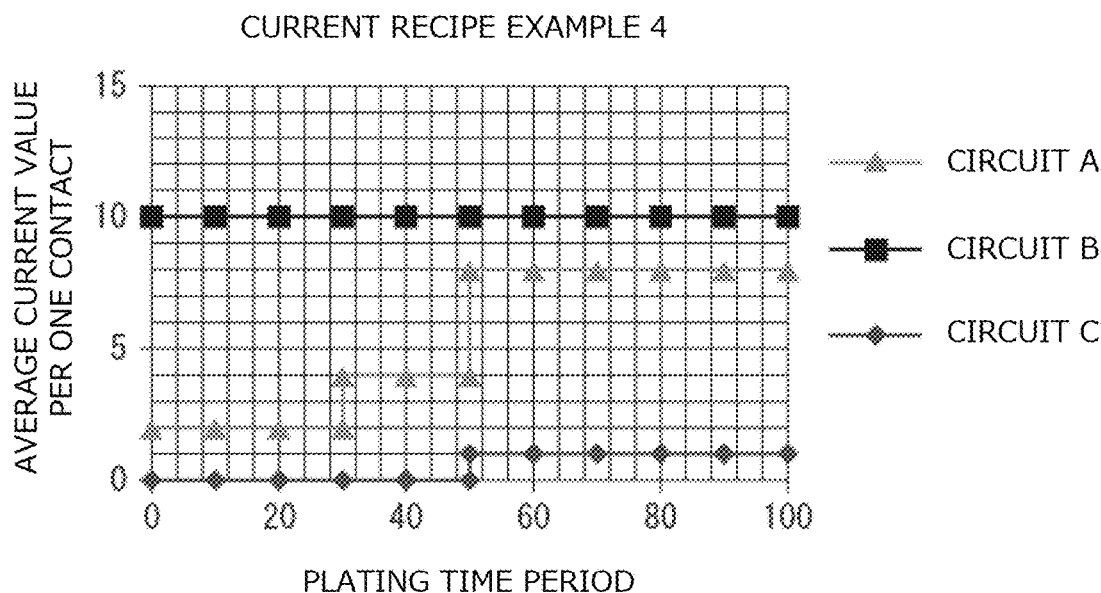
FIG. 13 is a graph showing a recipe example of currents which flow in the circuit A, the circuit B and the circuit C.
Figure 14:
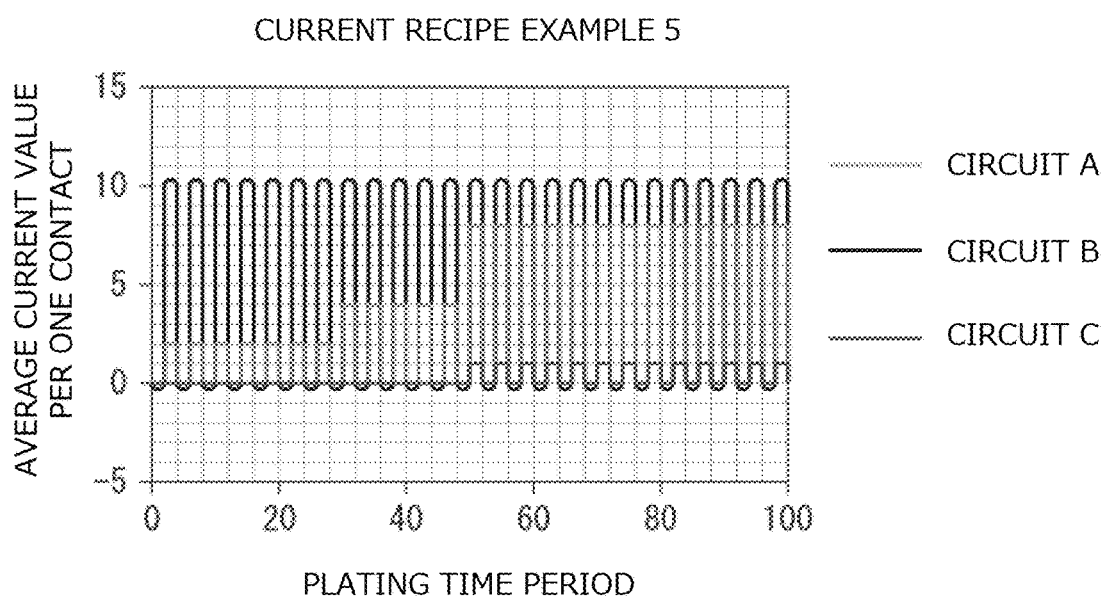
FIG. 14 is a graph showing a recipe example of currents which flow in the circuit A, the circuit B and the circuit C.

In an example shown in FIG. 13, in the circuit A, a current of approximately 2 A flows up to 30% of a plating time period, a current of approximately 4 A flows up to 50% from 30% of the plating time period, and a current of approximately 8 A flows from 50% of the plating time period. Further, in the circuit B, a current of approximately 10 A flows throughout the entire plating process. In the circuit C, a current of 0 A flows up to 50% of the plating time period, and a current of approximately 1 A flows from 50% of the plating time period.

The example shown in FIG. 13 differs from the example shown in FIG. 12 in a point that as the plating process advances, the value of the current which flows in the circuit A increases in multiple stages. As described in relation to FIG. 21A to FIG. 21C, the terminal effect in the side central regions A1 gradually changes. That is, the electric field in the side central region A1 gradually changes. Consequently, in the example shown in FIG. 13, the value of the current which flows in the circuit A is increased in the multiple stages in accordance with the change of the terminal effect, and therefore, in-plane uniformity of the film thickness can be more enhanced as compared with the example of FIG. 12 in which the value of the current which flows in the circuit A changes in the single stage. In FIG. 13, a timing for switching the current so that the current of approximately 8 A flows in the circuit A is set as 50% of the plating time period, but other numeric values such as 40% of the plating time period, or 60% of the plating time period can be also selected, for example.

In the same way as the value of the current in the circuit A is changed in the multiple stages, the values of the currents in the circuit B and the circuit C may be changed in multiple stages in accordance with necessity. Further, the values of the currents in the circuit A, the circuit B and the circuit C may be continuously changed like linear functions. Further, as in an example shown in FIG. 14, pulse currents may be passed as the currents in the circuit A, the circuit B and the circuit C.

Although the process of plating the quadrangular substrate Wf is described above, the present invention is not limited to this, and plating can be applied to the substrates Wf in a triangular shape, a pentagonal shape and shapes with more sides than the pentagonal shape by the similar process.

Figure 15:
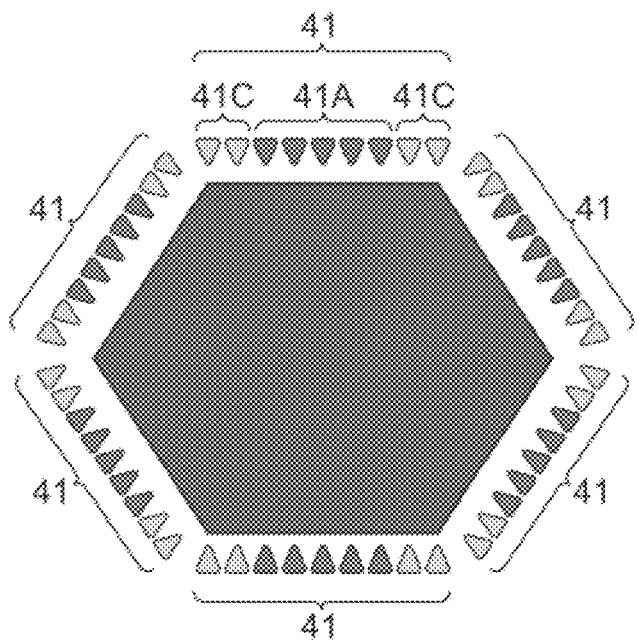
FIG. 15 is a schematic diagram showing a positional relation of the substrate and the power feeding members.

Next, another process of plating the substrate Wf will be described. FIG. 15 is a schematic view showing a positional relation of the substrate Wf and the power feeding members 41. In an example shown in FIG. 15, the substrate Wf is hexagonal, and the power feeding members 41 are disposed along six sides of the substrate Wf.

The power feeding member 41 which is shown in FIG. 15 includes the first power feeding members 41A capable of contacting a side central region including a central portion of the side of the substrate Wf, and the third power feeding members 41C capable of contacting corner regions that are close to corner portions of the substrate Wf. That is, a power feeding member corresponding to the second power feeding members 41B capable of contacting intermediate regions adjacent to the side central region shown in FIG. 5 are not present.

The first power feeding members 41A are electrically connected to the power supply 15A shown in FIG. 2, and a voltage is applied by the power supply 15A. Here, a circuit including the first power feeding members 41A and the power supply 15A is referred to as the circuit A. The third power feeding members 41C are electrically connected to the power supply 15C shown in FIG. 2, and a voltage is applied by the power supply 15C. Here, a circuit including the third power feeding members 41C and the power supply 15C is referred to as the circuit C.

Next, recipe examples of currents which the power supplies 15A and 15C pass to the circuit A and the circuit C will be described. FIG. 16 to FIG. 20 are graphs showing the recipe examples of the currents which flow in the circuit A and the circuit C. In each of the graphs, a horizontal axis represents a plating time period (%), and a vertical axis represents a current recipe (A). The power supplies 15A and 15C are controlled by the control device 17 shown in FIG. 2 so that the currents shown in FIG. 16 to FIG. 20 flow in the circuit A and the circuit C.

Figure 16:
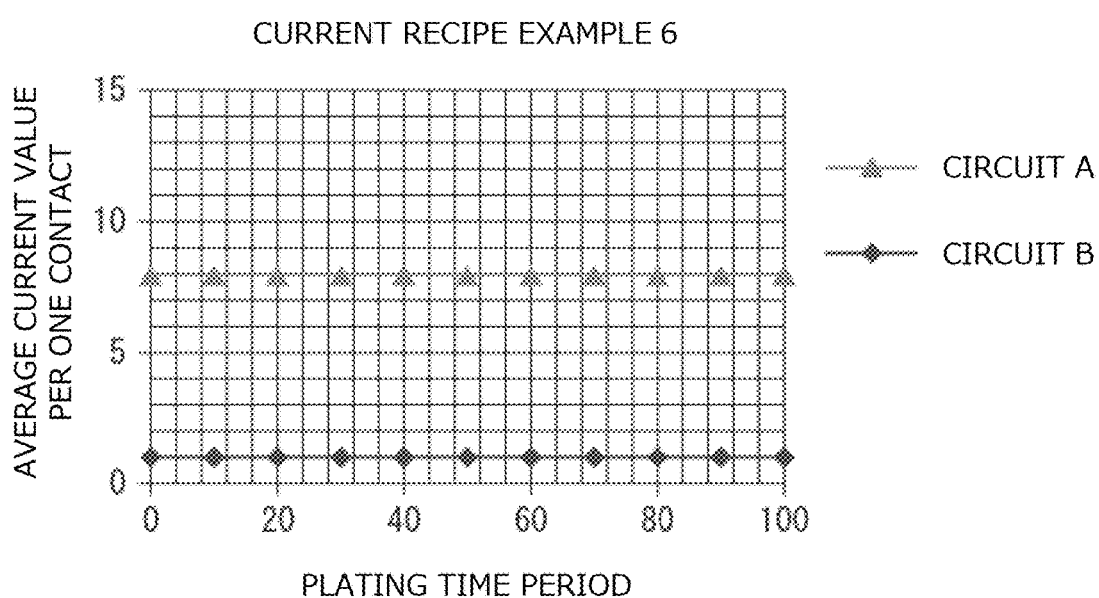
FIG. 16 is a graph showing a recipe example of currents which flow in the circuit A and the circuit C.

In an example shown in FIG. 16, a constant current of approximately 8 A flows in the circuit A, and a constant current of approximately 1 A flows in the circuit C, throughout the entire plating process. That is, the power supplies 15A, 15B and 15C are controlled so that currents of different values respectively flow in the circuit A and the circuit C.

As described in relation to FIG. 21A to FIG. 21C, in the side central regions A1 of the quadrangular substrate S1, an electric field concentrates at the initial stage of plating due to a terminal effect, and as plating advances, the current density becomes small. Meanwhile, in the corner regions A2 of the quadrangular substrate S1, an electric field continues to concentrate from the initial stage of plating to an end time. Consequently, the corner regions A2 tend to have a larger film thickness as compared with the side central regions A1.

Consequently, in the example shown in FIG. 16, the value of the current which is supplied to the third power feeding members 41C (the circuit C) which contact the corner regions which tend to have the largest film thickness is made smaller as compared with the value of the current which is supplied to the circuit A.

By controlling the power supplies 15A and 15C as shown in FIG. 16, reduction of the in-plane uniformity of the film thickness, which occurs due to ununiformity of the electric field which is caused by the terminal effect of the polygonal substrate Wf and the plating bath structure is compensated, and the in-plane uniformity of the film thickness can be enhanced.

Figure 17:
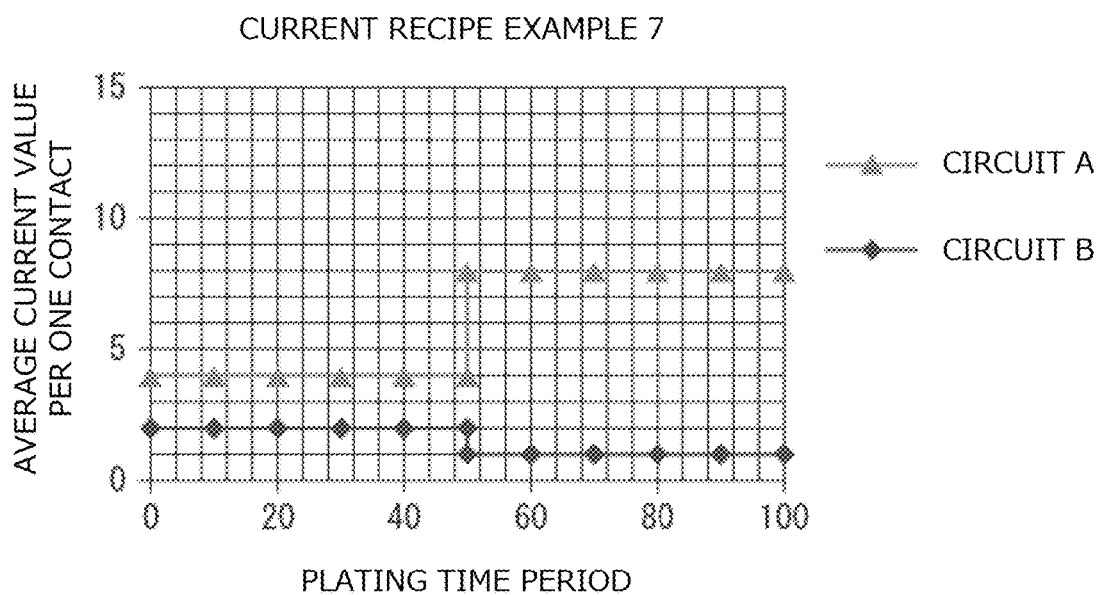
FIG. 17 is a graph showing a recipe example of currents which flow in the circuit A and the circuit C.

In an example shown in FIG. 17, in the circuit A, a current of approximately 4 A flows up to 50% of the plating time period, and a current of approximately 8 A flows from 50% of the plating time period. In the circuit C, a current of approximately 2 A flows up to 50% of the plating time period, and a current of approximately 1 A flows from 50% of the plating time period.

The example shown in FIG. 17 differs from the example shown in FIG. 16 in a point that the values of the currents which flow in the circuit A and the circuit C are changed halfway through plating. That is, the value of the current which flows in the circuit A is increased stepwise halfway through plating. As described in relation to FIG. 21A to FIG. 21C, in the side central regions A1 of the quadrangular substrate S1, an electric field concentrates at the initial stage of plating due to a terminal effect, and as plating advances, the current density becomes smaller. Consequently, the value of the current is made relatively small at the initial stage of plating at which the electric field concentrates, and the value of the current is made relatively large at a middle stage of plating at which the current density becomes small. The current value is changed in accordance with the terminal effect, and therefore as compared with the example in FIG.

16 where a constant current continues to be passed, the in-plane uniformity of the film thickness can be more enhanced.

Further, in the example shown in FIG. 17, the value of the current which flows in the circuit C is decreased halfway through plating. As described in relation to FIG. 21A to FIG. 21C, in the corner regions A2 of the substrate, the electric field continues to concentrate consistently from the initial stage of plating to the end time, but concentration of the electric field at the initial stage of plating is somewhat small. Consequently, at the initial stage of plating, the value of the current is made relatively large, and at the middle stage of plating at which concentration of the electric field becomes large, the value of the current is made relatively small. The current value is changed in accordance with the change of the terminal effect, and therefore the in-plane uniformity of the film thickness can be enhanced more as compared with the example of FIG. 16 in which a constant current continues to be passed.

Figure 18:
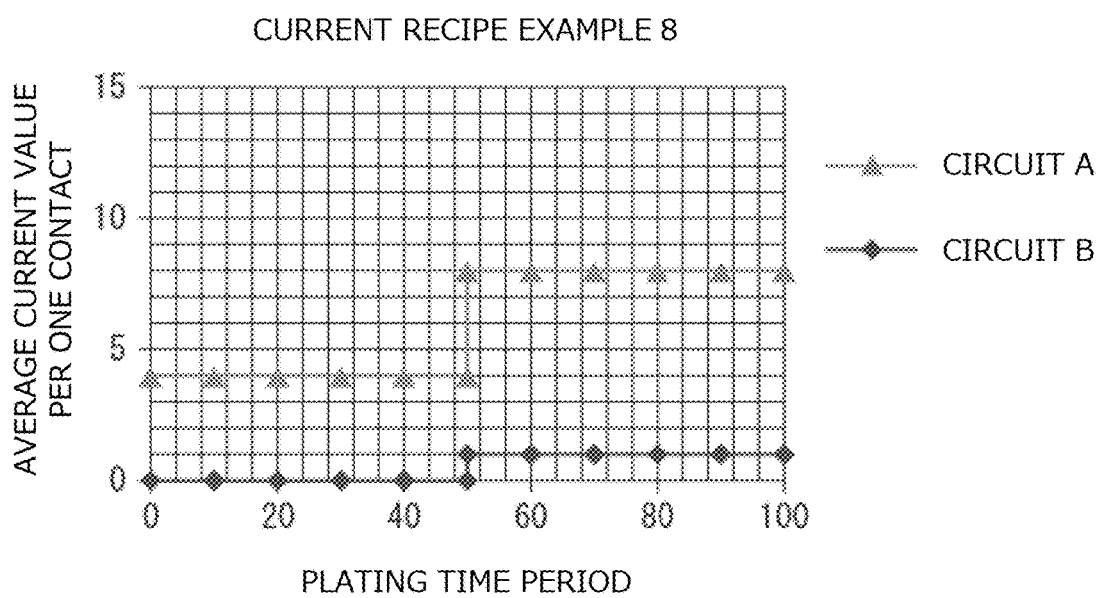
FIG. 18 is a graph showing a recipe example of currents which flow in the circuit A and the circuit C.

In an example shown in FIG. 18, in the circuit A, a current of approximately 4 A flows up to 50% of the plating time period, and a current of approximately 8 A flows from 50% of the plating time period. In the circuit C, a current of 0 A flows up to 50% of the plating time period, and a current of approximately 1 A flows from 50% of the plating time period.

The example shown in FIG. 18 differs from the example shown in FIG. 17 in a point that no current flows in the circuit C up to 50% of the plating time period. As described in relation to FIG. 21A to FIG. 21C, the corner regions A2 of the substrate tend to have a larger film thickness as compared with the side central regions A1 and the intermediate regions A3. Consequently, in the example shown in FIG. 18, increase of the film thickness of the corner regions A2 can be restrained by providing the time period in which no current flows in the circuit C in the plating process.

Figure 19:
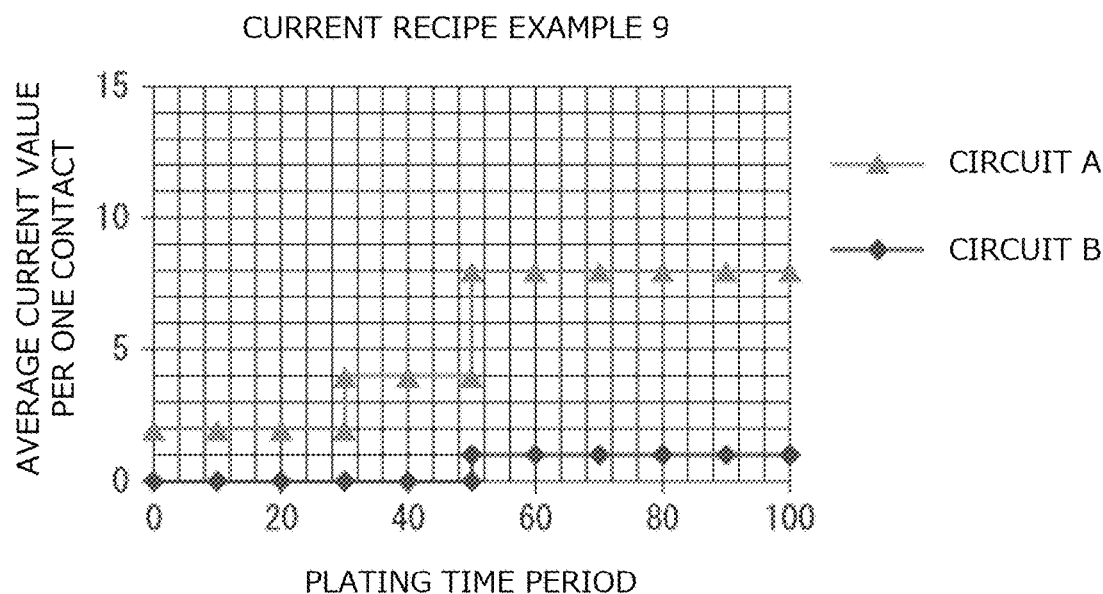
FIG. 19 is a graph showing a recipe example of currents which flow in the circuit A and the circuit C.
Figure 20:
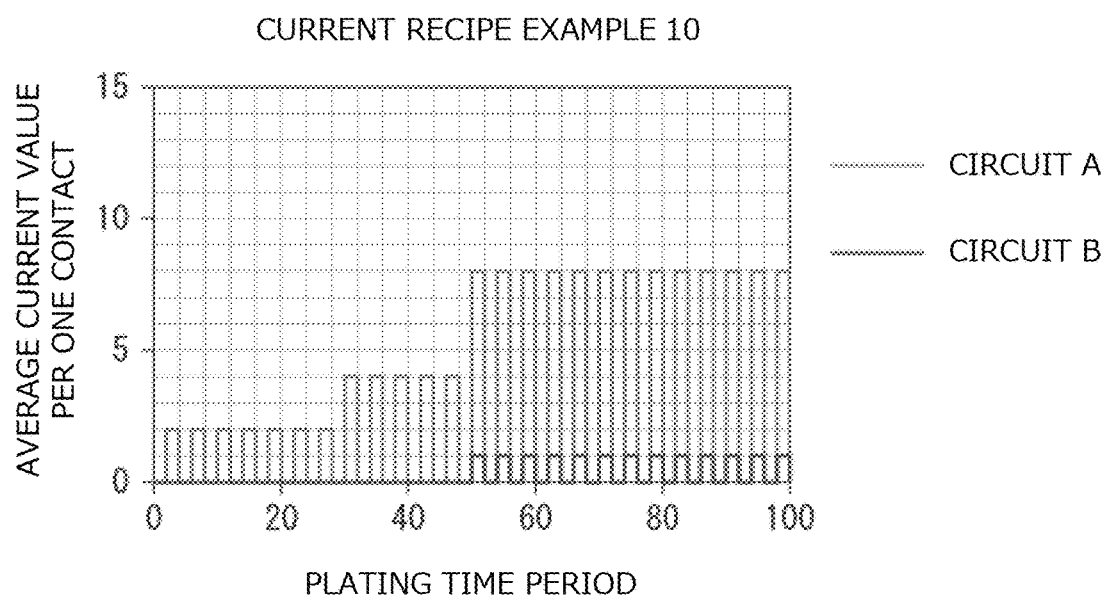
FIG. 20 is a graph showing a recipe example of currents which flow in the circuit A and the circuit C.

In an example shown in FIG. 19, in the circuit A, a current of approximately 2 A flows up to 30% of the plating time period, a current of approximately 4 A flows from 30% of the plating time period up to 50%, and a current of approximately 8 A flows from 50% of the plating time period. Further, in the circuit C, a current of 0 A flows up to 50% of the plating time period, and a current of approximately 1 A flows from 50% of the plating time period.

The example shown in FIG. 19 differs from the example shown in FIG. 18 in a point that as the plating process advances, the value of the current which flows in the circuit A increases in multiple stages. As described in relation to FIG. 21A to FIG. 21C, the terminal effect in the side central regions A1 gradually changes. That is, the electric field in the side central regions A1 gradually changes. Consequently, in the example shown in FIG. 19, the value of the current which flows in the circuit A is increased in the multiple stages in accordance with the change of the terminal effect, and therefore, in-plane uniformity of the film thickness can be enhanced more as compared with the example in FIG. 18 in which the value of the current which flows in the circuit A changes in the single stage.

In the same way as the value of the current in the circuit A is changed in the multiple stages, the value of the current in the circuit C may be also changed in the multiple stages in accordance with necessity. Further, the values of the currents in the circuit A and the circuit C may be continuously changed like linear functions, instead of in the multiple stages. Further, as in an example shown in FIG. 20, pulse currents may be passed as the currents in the circuit A and the circuit C.

In the examples shown in FIG. 15 to FIG. 20, the substrate holder 30 is described as having the first power feeding members 41A and the third power feeding members 41C. However, the substrate holder 30 may be configured to include the first power feeding members 41A and the second power feeding members 41B. Currents that flow in the circuit A and the circuit B in this case can be made similar to the currents which flow in the circuit A and the circuit B which are shown in FIG. 10 to FIG. 14.

Although the embodiment of the present invention is described thus far, the embodiment of the invention described above is for facilitating understanding of the present invention, and does not intend to limit the present invention. It is needless to say that the present invention can be modified and altered without departing from the gist of the present invention, and the present invention includes equivalents thereof. Further, an arbitrary combination or omission of the respective components described in the claims and the description can be made, in the range in which at least a part of the aforementioned problem can be solved, or in the range in which at least a part of the effect is provided.

REFERENCE SIGNS LIST

10 Plating unit
15A, 15B, 15C Power supply
17 Control device
30 Substrate holder
34 Holding surface
37 External contact section
37A First external contact section
37B Second external contact section
37C Third external contact section
41 Power feeding member
41A First power feeding member
41B Second power feeding member
41C Third power feeding member
43A First contact section
43B Second contact section
43C Third contact section
45A First contact wiring
45B Second contact wiring
45C Third contact wiring
46A First plate
46B Second plate
46C Third plate
47A First power feeding wiring
47B Second power feeding wiring
47C Third power feeding wiring
A1 Side central region
A2 Corner central region
A3 Intermediate region
Wf Polygonal substrate

What is claimed is:

1. A plating apparatus, comprising:
an anode holder configured to hold an anode;
a substrate holder configured to hold a polygonal substrate;
a plating bath for accommodating the anode holder and the substrate holder, and dipping the anode and the substrate in a plating solution; and
a control device for controlling a current that flows between the anode and the substrate,
wherein the substrate holder has a plurality of power feeding members that are disposed in a substantially straight line along a side of the polygonal substrate, and the control device is configured to be able to control the current so that currents of at least two different values are supplied to the plurality of power feeding members.

2. The plating apparatus according to claim 1,
wherein the power feeding members include first power feeding members capable of contacting side central regions including central portions of the sides of the polygonal substrate, and second power feeding members capable of contacting intermediate regions adjacent to the side central regions or third power feeding members capable of contacting regions that are closer to corner portions of the polygonal substrate than the intermediate regions, and the control device is configured to be able to control the current to supply currents of different values respectively to the first power feeding members and the second power feeding members or the third power feeding members.

3. The plating apparatus according to claim 1,
wherein the power feeding members include first power feeding members capable of contacting side central regions including central portions of the sides of the polygonal substrate, and second power feeding members capable of contacting intermediate regions adjacent to the side central regions and third power feeding members capable of contacting regions that are closer to corner portions of the polygonal substrate than the intermediate regions, and the control device is configured to be able to control the current to supply currents of different values respectively to the first power feeding members and the second power feeding members and the third power feeding members.

4. The plating apparatus according to claim 2,
wherein the control device is configured to be able to control the currents so that a value of a current that flows in the second power feeding members becomes larger than a value of a current that flows in the first power feeding members.

5. The plating apparatus according to claim 2,
wherein the control device is configured to be able to control the currents so that a current of a first value is supplied to the first power feeding members at a time of start of plating, and thereafter a current of a second value that is larger than the first value is supplied to the first power feeding members.

6. The plating apparatus according to claim 5,
wherein the control device is configured to be able to control the currents so that the current that flows in the first power feeding members increases stepwise from the first value to the second value.

7. The plating apparatus according to claim 5,
wherein the control device is configured to be able to control the currents so that the current which flows in the first power feeding members increases continuously from the first value to the second value.

8. The plating apparatus according to claim 2,
wherein the control device is configured to be able to control the currents so that a value of the current that flows in the third power feeding members becomes smaller than the value of the current that flows in the first power feeding members.

9. The plating apparatus according to claim 2,
wherein the third power feeding members are configured to contact regions other than points of intersection of the sides of the polygonal substrate.

* * * * *